United States Patent
Rigoni et al.

(10) Patent No.: US 10,884,092 B2
(45) Date of Patent: Jan. 5, 2021

(54) NON-ORTHOGONALITY COMPENSATION OF A MAGNETIC FIELD SENSOR

(71) Applicant: Allegro MicroSystems, LLC, Manchester, NH (US)

(72) Inventors: Nicolas Rigoni, Buenos Aires (AR); Octavio H. Alpago, Ciudad de Buenos Aires (AR); Nicolas Rafael Biberidis, Barcelona (ES); Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 195 days.

(21) Appl. No.: 16/214,768

(22) Filed: Dec. 10, 2018

(65) Prior Publication Data

US 2019/0113592 A1  Apr. 18, 2019

Related U.S. Application Data

(63) Continuation-in-part of application No. 15/180,199, filed on Jun. 13, 2016, now Pat. No. 10,288,698.

(51) Int. Cl.
*G01R 35/00* (2006.01)
*G01R 33/02* (2006.01)
*G01R 33/00* (2006.01)

(52) U.S. Cl.
CPC ......... *G01R 35/00* (2013.01); *G01R 33/0017* (2013.01); *G01R 33/0029* (2013.01); *G01R 33/02* (2013.01)

(58) Field of Classification Search
USPC ........................................................ 702/92
See application file for complete search history.

(56) References Cited

U.S. PATENT DOCUMENTS

| 4,933,640 A | 6/1990 | Kuckes |
| 9,417,295 B2 | 8/2016 | Friedrich et al. |

(Continued)

FOREIGN PATENT DOCUMENTS

| IE | 2009/0465 | 12/2009 |
| JP | 2016-61708 A | 4/2016 |
| WO | WO 2015/156635 A1 | 10/2015 |

OTHER PUBLICATIONS

EP Communication pursuant to Rules 161 (1) and 162EPC—Correction of deficiencies dated Jan. 25, 2019 for EP Pat. Appl. No. 17730321-1022; 3 pages.

(Continued)

*Primary Examiner* — Paul D Lee
(74) *Attorney, Agent, or Firm* — Daly, Crowley, Mofford & Durkee, LLP

(57) ABSTRACT

A magnetic field sensor includes a first magnetic field sensing element first generating a first signal having a first axis of maximum sensitivity, a second magnetic field sensing element for generating a second signal and having a second axis of maximum sensitivity, one or more detectors for receiving an output of the first magnetic field sensing element or the second magnetic field sensing element, and a processor that receives an output of the one or more detectors and uses the output of the one or more detectors to calculate a first constant $K_c$ and a second constant $K_s$ and then uses $K_c$ and $K_s$ to compensate for an orthogonality error between the first axis of maximum sensitivity and second axis of maximum sensitivity. The detectors include peak detectors and/or zero-crossing detectors that compare the output of the first input signal or the second input signal with a threshold or zero.

26 Claims, 14 Drawing Sheets

(56) References Cited

U.S. PATENT DOCUMENTS

| | | |
|---|---|---|
| 9,739,847 B1 | 8/2017 | Alpago et al. |
| 2002/0180428 A1 | 12/2002 | Weser |
| 2005/0283988 A1 | 12/2005 | Sato et al. |
| 2006/0089784 A1 | 4/2006 | Spicer et al. |
| 2006/0290545 A1 | 12/2006 | Granig et al. |
| 2009/0174395 A1 | 7/2009 | Thomas et al. |
| 2009/0212771 A1* | 8/2009 | Cummings ........ G01R 33/0029 324/252 |
| 2011/0267041 A1 | 11/2011 | Li et al. |
| 2013/0265037 A1 | 10/2013 | Friedrich et al. |
| 2013/0314075 A1* | 11/2013 | Ausserlechner ....... G01D 3/036 324/202 |
| 2015/0022186 A1 | 1/2015 | Ausserlechner |
| 2017/0356966 A1 | 12/2017 | Romero |
| 2017/0356967 A1 | 12/2017 | Romero |
| 2018/0017418 A1 | 1/2018 | Deak |

OTHER PUBLICATIONS

U.S. Appl. No. 16/887,898, filed May 29, 2020, Rigoni et al.
Response Filed on Jul. 31, 2019 for European Application No. 17730321.1; 23 Pages.
Notice of Allowance dated Feb. 25, 2019 for U.S. Appl. No. 15/180,199; 10 pages.
PCT International Preliminary Report on Patentability dated Dec. 27, 2018; for International Application No. PCT/US2017/035702; 10 pages.
PCT International Search Report and Written Opinion dated Aug. 28, 2017 for International Application No. PCT/US2017/035702; 15 pages.
U.S. Non-Final Office Action dated Jul. 27, 2018 for U.S. Appl. No. 15/180,199; 13 pages.
Response to U.S. Non-Final Office Action dated Jul. 27, 2018 for U.S. Appl. No. 15/180,199; Response filed Oct. 24, 2018; 15 pages.

* cited by examiner

NON-ORTHOGONALITY COMPENSATION OF A MAGNETIC FIELD SENSOR

CROSS REFERENCE TO RELATED APPLICATIONS

This application is a Continuation-in-Part application of and claims the benefit under 35 U.S.C. § 120 of U.S. application Ser. No. 15/180,199 filed on Jun. 13, 2016, which is incorporated herein by reference in its entirety.

STATEMENT REGARDING FEDERALLY SPONSORED RESEARCH

Not Applicable.

FIELD

The present disclosure relates generally to addressing orthogonality error associated with a magnetic field angle sensor.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples.

Sensor integrated circuits are widely used in automobile control systems and other safety critical applications. There are a variety of specifications that set forth requirements related to permissible sensor quality levels, failure rates, and overall functional safety.

One type of magnetic field sensor is an angle sensor that senses an angle of a direction of a magnetic field. Some angle sensors include a first channel (e.g., along an x-axis) for a first magnetic field sensing element and a second channel (e.g., along a y-axis) for a second magnetic field sensing element that are aligned with respect to each other. It is important that the alignment of the first magnetic field sensing element with respect to the second magnetic field sensing element be accurate so that the measurement of signals by each magnetic field sensing element with respect to each other is also accurate. If the first magnetic field sensing element is even slightly off from the expected position with respect to the second magnetic field sensing element, then there is considered to be an orthogonality error between the two channels and the measurements and calculations may be not be accurate.

SUMMARY

The present disclosure provides magnetic field sensors and associated methods of compensating for an orthogonality error of the magnetic field sensor. The method uses detectors to compensate for an orthogonality error in a production environment, in use when determining the angle of the magnetic field, or both. Some embodiments use peak detectors and/or zero detectors to detect peaks and zero-crossing points of the magnetic field signal for each channel.

According to the disclosure, a method of determining an orthogonality error of a magnetic field sensor includes receiving a first input signal on a first channel of the magnetic field sensor; receiving a second input signal on a second channel of the magnetic field sensor, removing offset and gain from the first input signal and the second input signal to generate a first offset and gain compensated signal and a second offset and gain compensated signal, applying one or more zero-crossing detectors to the first and second offset and gain compensated signals, applying one or more peak detectors to the first and second offset and gain compensated signals, using an output of the one or more zero-crossing detectors and the one or more peak detectors to calculate a first constant and a second constant, wherein each of the first constant and the second constant is a function of the orthogonality error, and using the first constant and the second constant to compensate for the orthogonality error between the first channel and the second channel of the magnetic field sensor.

The method can include one or more of the following features alone or in combination. The first input signal and the second input signal can be received at substantially the same time. The first input signal and the second input signal can be magnetic field signals indicative of a magnetic field affected by a target proximate the magnetic field sensor. Applying the one or more zero-crossing detectors to the first and second offset and gain compensated signals can include applying a first zero-crossing detector to the first offset and gain compensated signal to identify a first zero-crossing point in the first offset and gain compensated signal, applying a second zero-crossing detector to the first offset and gain compensated signal to identify a second zero-crossing point in the first offset and gain compensated signal, applying a third zero-crossing detector to the second offset and gain compensated signal to identify a first zero-crossing point in the second offset and gain compensated signal, and applying a fourth zero-crossing detector to the second offset and gain compensated signal to identify a second zero-crossing point in the second offset and gain compensated signal. Applying the one or more peak detectors to the first and second offset and gain compensated signals can include applying a first peak detector to the first offset and gain compensated signal to identify a positive peak value in the first offset and gain compensated signal, applying a second peak detector to the first offset and gain compensated signal to identify a negative peak value in the first offset and gain compensated signal, applying a third peak detector to the second offset and gain compensated signal to identify a positive peak value in the second offset and gain compensated signal, and applying a fourth peak detector to the second offset and gain compensated signal to identify a negative peak value in the second offset and gain compensated signal. Using the first constant and the second constant to compensate for the orthogonality error between the first channel and the second channel of the magnetic field sensor can include cross-summing the first offset and gain compensated signal with the second offset and gain compensated signal to generate a first intermediate channel signal and a second intermediate channel signal, multiplying the first intermediate channel signal by a first approximation of the first constant to generate a first orthogonality compensated signal, and multiplying the second intermediate channel signal by a second approximation of the second constant to generate a second orthogonality compensated signal. The method can further include, prior to receiving the first input signal on the first channel of the magnetic field sensor: setting the first input signal at a first input of a processor to a constant value, during the setting of the first input signal, measuring a first transition at an output of the processor, setting the second input signal at a second input of a processor to the constant value, during the setting of the second input signal, measuring a second transition at the output of the processor, and using a deviation between the first transition and the second transition from respective expected transitions of the output signal of the processor to calculate the first constant and the second constant. The first input signal can be set to the constant value during a first time period, and the second input signal can be set to the constant value during a second time period different than the first time period.

Also described is a method of determining an orthogonality error of a magnetic field sensor, the method including receiving a first input signal on a first channel of the magnetic field sensor, receiving a second input signal on a second channel of the magnetic field sensor, applying one or more detectors to the first input signal and the second input signal, using an output of the one or more detectors to calculate a first constant and a second constant, wherein each of the first constant and the second constant is a function of the orthogonality error, and using the first constant and the second constant to compensate for the orthogonality error between the first channel and the second channel of the magnetic field sensor.

The magnetic field sensor can include one or more of the following features alone or in combination. The one or more detectors can comprise one or more peak detectors, wherein the one or more peak detectors are configured to compare the output of the first input signal or the second input signal to a threshold value, and wherein the threshold value can comprise a predetermined value that is determined to be a peak for the first input signal or the second input signal. The one or more detectors can comprise one or more peak detectors, and wherein applying the one or more peak detectors to the first input signal and the second input signal can comprise applying a first peak detector to the first input signal to identify a positive peak value in the first input signal, applying a second peak detector to the first input signal to identify a negative peak value in the first input signal, applying a third peak detector to the second input signal to identify a positive peak value in the second input signal, and applying a fourth peak detector to the second input signal to identify a negative peak value in the second input signal. The one or more detectors can include one or more zero-crossing detectors, and wherein the threshold value comprises zero to determine the zero-crossing values of the first input signal or the second input signal. The one or more detectors can comprise one or more zero-crossing detectors, and wherein applying the one or more zero-crossing detectors to the first input signal and the second input signal can include applying a first zero-crossing detector to the first input signal to identify a first zero-crossing point in the first input signal, applying a second zero-crossing detector to the first input signal to identify a second zero-crossing point in the first input signal, applying a third zero-crossing detector to the second input signal to identify a first zero-crossing point in the second input signal, and applying a fourth zero-crossing detector to the second input signal to identify a second zero-crossing point in the second input signal. The one or more detectors can include one or more peak detectors and one or more zero-crossing detectors, and wherein applying the one or more detectors to the first input signal and the second input signal can include applying a first peak detector to the first input signal to identify a positive peak value in the first input signal, applying a second peak detector to the first input signal to identify a negative peak value in the first input signal, applying a third peak detector to the second input signal to identify a positive peak value in the second input signal, applying a fourth peak detector to the second input signal to identify a negative peak value in the second input signal, applying a first zero-crossing detector to the first input signal to identify a first zero-crossing point in the first input signal, applying a second zero-crossing detector to the first input signal to identify a second zero-crossing point in the first input signal, applying a third zero-crossing detector to the second input signal to identify a first zero-crossing point in the second input signal, and applying a fourth zero-crossing detector to the second input signal to identify a second zero-crossing point in the second input signal. The method can further include using the positive peak value and the negative peak value in the first input signal, the positive peak value and the negative peak value in the second signal, the first zero-crossing point and the second zero-crossing point in the first input signal, and the first zero-crossing point and the second zero-crossing point in the second input signal to generate the first constant and the second constant. The first input signal and the second input signal can be received at substantially the same time. The method can further include storing the first constant and the second constant in a memory coupled to the magnetic field sensor. The method can further include setting the first input signal at a first input of a processor to a constant value, during the setting of the first input signal, measuring a first transition at an output of the processor, setting the second input signal at a second input of a processor to the constant value, during the setting of the second input signal, measuring a second transition at the output of the processor, and using a deviation between the first transition and the second transition from respective expected transitions of the output signal of the processor to calculate the first constant and the second constant.

According to a further aspect, a magnetic field sensor can include a first magnetic field sensing element for generating a first input signal and having a first axis of maximum sensitivity, a second magnetic field sensing element for generating a second input signal and having a second axis of maximum sensitivity, one or more detectors for receiving an output of the first magnetic field sensing element or the second magnetic field sensing element, and at least one processor that receives an output of the one or more detectors and uses the output of the one or more detectors to calculate a first constant and a second constant, and then uses the first constant and the second constant to compensate for an orthogonality error between the first axis of maximum sensitivity and the second axis of maximum sensitivity.

The magnetic field sensor can include one or more of the following features alone or in combination. The one or more detectors can include one or more peak detectors, wherein the one or more peak detectors are configured to compare the output of the first input signal or the second input signal to a threshold value, and wherein the threshold value can comprise a predetermined value that is determined to be a peak for the first input signal or the second input signal. Applying the one or more peak detectors can comprises applying a first peak detector to the first input signal to identify a positive peak value in the first input signal, applying a second peak detector to the first input signal to identify a negative peak value in the first input signal, applying a third peak detector to the second input signal to identify a positive peak value in the second input signal, and applying a fourth peak detector to the second input signal to identify a negative peak value in the second input signal. The one or more detectors can comprise at least one peak detector and at least one zero-crossing detector. Applying the at least one peak detector and the at least one zero-crossing detector can comprise applying a first peak detector to the first input signal to identify a positive peak value in the first input signal, applying a second peak detector to the first input signal to identify a negative peak value in the first input signal, applying a third peak detector to the second input signal to identify a positive peak value in the second input signal, applying a fourth peak detector to the second input signal to identify a negative peak value in the second input signal, applying a first zero-crossing detector to the first input signal to identify a first zero-crossing point in the first input signal, applying a second zero-crossing detector to the first input signal to identify a second zero-crossing point in the first input signal, applying a third zero-crossing detector to the second input signal to identify a first zero-crossing point in the second input signal, and applying a fourth zero-crossing detector to the second input signal to identify a second zero-crossing point in the second input signal. The processor can comprise one or more of a CORDIC processor, a look-up table, or a polynomial approximator.

According to a further aspect, a magnetic field sensor can include a method of determining an orthogonality error of a magnetic field sensor, the method comprising setting a first input signal at a first input of a processor to a constant value during a first time period, during the first time period, measuring a first transition at an output of the processor, setting a second input signal at a second input of a processor to the constant value during a second time period different than the first time period, during the second time period, measuring a second transition at the output of the processor, receiving a first input signal on a first channel of the magnetic field sensor during a third time period different than the first time period and different than the second time period, receiving a second input signal on a second channel of the magnetic field sensor during the third time period, applying one or more detectors to the first input signal and the second input signal receiving during the third time period, using an output of the one or more detectors and a deviation between the first transition and the second transition from respective expected transitions of the output signal of the processor to calculate a first constant and a second constant, wherein each of the first constant and the second constant is a function of the orthogonality error, and using the first constant and the second constant to compensate for the orthogonality error between the first channel and the second channel of the magnetic field sensor. The first time period can be non-overlapping with the second time period, and the second time period can be non-overlapping with the third time period.

BRIEF DESCRIPTION

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, and a magnetic field sensor that senses a magnetic field density of a magnetic field.

As used herein, the terms "target" and "magnetic target" are used to describe an object to be sensed or detected by a magnetic field sensor or magnetic field sensing element. The object may be a magnet or other magnetic object.

Figure 1:
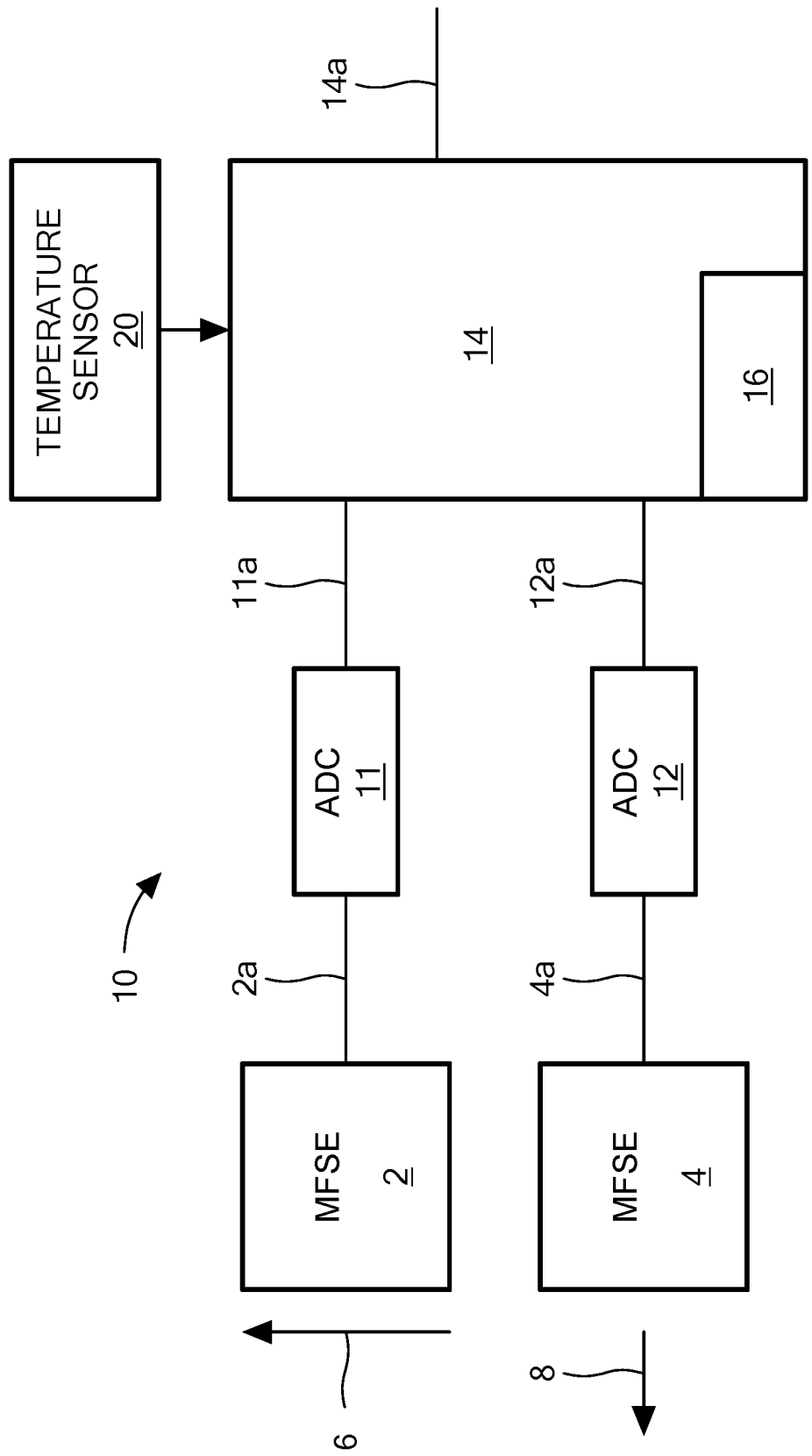
FIG. 1 is a block diagram of a system including a magnet and an XY-based magnetic field sensor for determining an angle of a direction of a magnetic field, according to the present disclosure.

FIG. 1 is a block diagram of a magnetic field sensor 10 for detecting a magnetic field, for example that is induced by a target or magnetic target. In an embodiment, the magnetic field may be a rotating magnetic field (e.g., due to a rotating target) and magnetic field sensor 10 may be configured to detect an angle of rotation of the magnetic field. However, in another embodiment, the magnetic field may be a generally static magnetic field (e.g., due to a stationary target) and magnetic field sensor 10 may be configured to detect an angle of the static magnetic field.

Magnetic field sensor 10 may include a first magnetic field sensing element 2 and a second magnetic field sensing element 4. In some embodiments, first and second magnetic field sensing elements 2 and 4 may comprise vertical Hall elements, magnetoresistance elements, or both. In one example, one or more of magnetic field sensing elements 2 and 4 may comprise a magnetoresistance bridge.

First magnetic field sensing element 2 and second magnetic field sensing element 4 may be positioned so an axis of maximum sensitivity of the first magnetic field sensing element 2 is orthogonal to an axis of maximum sensitivity of the second magnetic field sensing element 4. For example, if the axis of maximum sensitivity of the first magnetic field sensing element 2 is aligned with arrow 6, then the axis of maximum sensitivity of magnetic field sensing element 4 may be aligned with arrow 8, which is drawn at a relative direction ninety degrees from that of arrow 6. One skilled in the art will recognize that other directions of alignment may be used so that the axes of maximum sensitivity of magnetic field sensing elements 2 and 4 are orthogonal with respect to each other.

In an embodiment, magnetic field sensing element 2 and 4 may detect a pointing direction of a rotating (or static) magnetic field. In some figures below, it is assumed that the magnetic field is rotating. Signals 2a and 4a may be signals produced by first and second magnetic field sensing elements 2 and 4, respectively. Signals 2a and 4a may represent the strength of an external magnetic field as sensed by first and second magnetic field sensing elements 2 and 4. If first and second magnetic field sensing elements 2 and 4 are detecting the same external magnetic field, signals 2a and 4a may be quadrature signals, i.e. ninety degrees out of phase with each other. In an embodiment, this is due to the axes of maximum sensitivity of magnetic field sensing elements 2 and 4 having orthogonal alignment to each other.

Analog-to-digital converters (ADC) 11 and 12 may receive signals 2a and 4a, respectively, and convert them to digital signals 11a and 12a, respectively. Digital signals 11a and 12a may also be quadrature signals.

Magnetic field sensor 10 may also include a processor 14. In an embodiment, processor 14 may be a coordinate rotation digital computer (CORDIC) processor that can perform hyperbolic and/or trigonometric functions. More generally, processor 14 may include one or more of a CORDIC processor, a look-up table, or a polynomial approximator. In an embodiment, processor 14 may perform an arctangent function on received signals 11a and 12a and produce an output signal 14a that represents an angle of the magnetic field detected by magnetic field sensing elements 2 and 4. Processor 14 may also perform other signal processing functions to produce information about the detected magnetic field.

In an embodiment, processor 14 is a dedicated or custom circuit designed to perform signal processing. For example, if processor 14 performs an arctangent function, then processor 14 may be a circuit or processor designed specifically to perform that particular function. In other embodiments, processor 14 may be a general-purpose processor or a signal processor configured to perform signal processing functions. For example, processor 14 may comprise a memory 16 that stores software instructions, which, when executed by processor 14, cause processor 14 to perform its signal processing functions.

The memory 16 may comprise volatile memory, non-volatile memory, or both. Memory 16 may be configured to store software instructions (such as machine instructions, interpretable instructions such as scripts, and/or compiled instructions from firmware or software, etc.) and or data.

In an embodiment, first and second magnetic field sensing elements 2 and 4 may be physically aligned during manufacturing. If magnetic field sensing elements 2 and 4 are individual components, they may be placed (e.g. on a printed circuit board) so that their respective axes of maximum sensitivity are orthogonal. As another example, if magnetic field sensing elements 2 and 4 are formed on or as part of a common semiconductor die, they may be formed on or as part of the semiconductor die such that the axes of maximum sensitivity are orthogonal.

In certain cases, the first and second magnetic field sensing elements 2, 4 may be annealed after they are formed upon a semiconductor die. For example, if the first and second magnetic field sensing elements 2, 4 are magnetoresistance elements, pinned layers within the first and second magnetic field sensing element 2, 4 may be annealed to be orthogonal to each other after the magnetoresistance element is formed on or as part of the semiconductor die. Annealing will be understood to be a process in which magnetoresistance elements, at a late stage of manufacture, are placed under one or more conditions of respective predetermined temperature and respective predetermined magnetic field for a respective predetermined amount of time in order to set a direction of magnetic fields internal to the magnetoresistance elements. However, regardless of how the magnetic field sensing elements are formed or aligned, there may exist the possibility, due to manufacturing tolerances or error, that the axes of maximum sensitivity of magnetic field sensing elements 2 and 4 may not be perfectly orthogonal (i.e., may not be at perfect 90-degrees with respect to each other). In this situation, variations in the alignment of the axes of maximum sensitivity can produce a so-called orthogonality error.

The magnetic field sensor 10 can include a temperature sensor 20 coupled to the processor 14 to determine an ambient temperature of the magnetic field sensor 10. A change in temperature can be measured by the temperature sensor 10 used by the processor 14 to provide an approximation of a relative change in the orthogonality between the magnetic field sensing elements. The approximation of the relative change in the orthogonality can be combined with other orthogonality compensation techniques disclosed herein, either during production or post-production during operation of the magnetic field sensor.

Orthogonality compensation during "production" as described herein, for example, with respect to FIG. 1, generally refers to calculations and other processing that occur during the manufacturing or other production of the magnetic field sensor. The "production" orthogonality compensation techniques herein may also refer to a testing or testbench environment where the magnetic field sensor is not being used during normal operation, but rather in a test or test-type of environment, either prior to (or after) normal operation of the magnetic field sensor. In contrast, orthogonality compensation during "operation" or "normal operation" refers to calculations and other processing that occurs after the manufacture of the magnetic field sensor and during normal use of the magnetic field sensor in an application in which it is analyzing a magnetic field. It will be appreciated in light of the present disclosure that the production orthogonality compensation techniques can be readily combined with the orthogonality compensation techniques during normal operation to achieve performance as desired for a magnetic field sensor depending upon a particular application of the magnetic field sensor.

Figure 1A:
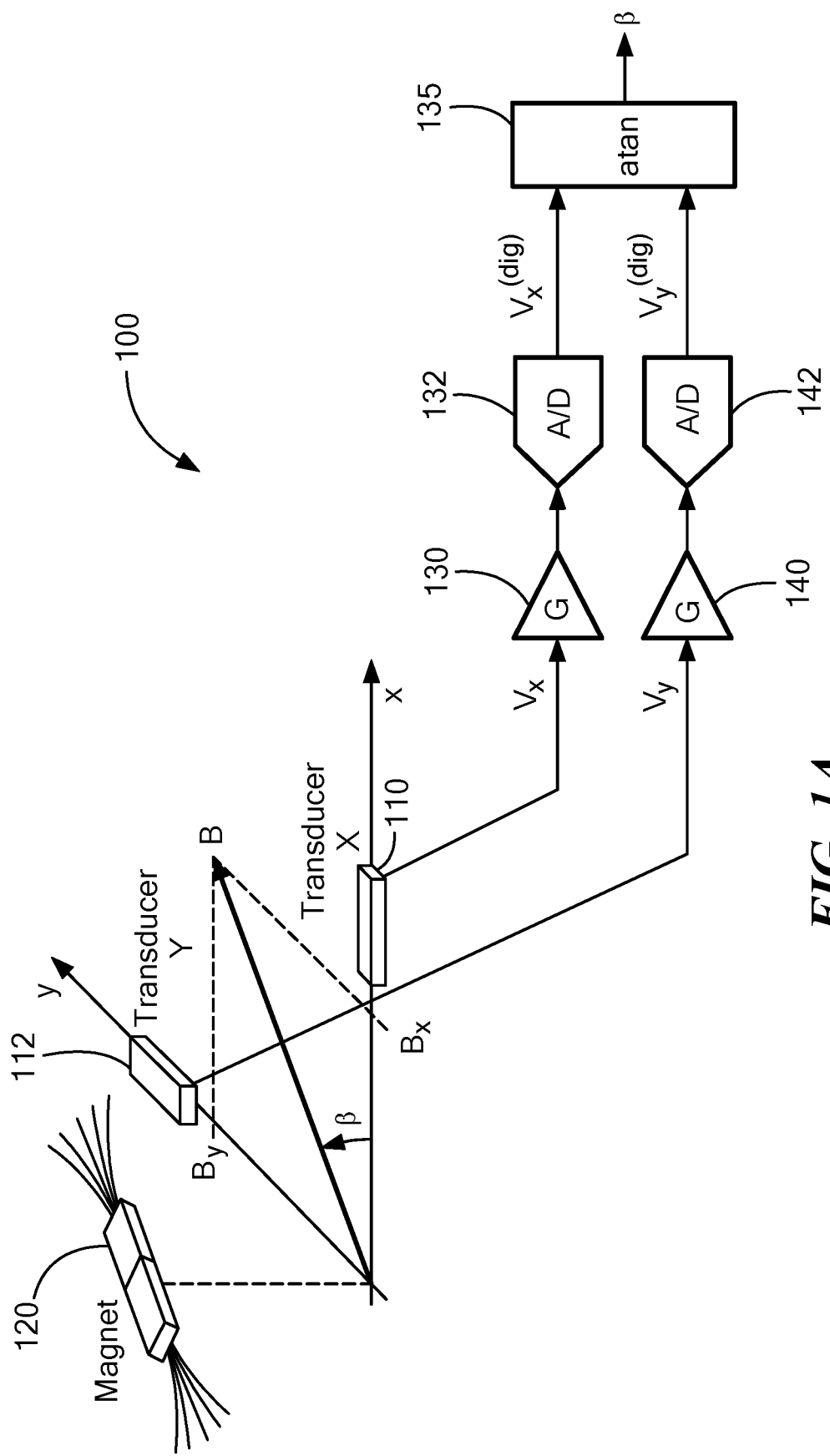
FIG. 1A is a block diagram of a magnetic field sensor for measuring a magnetic field.

Referring to FIG. 1A, is a block diagram of a system 100 including an XY-based angle sensor and a magnet 112 is shown, according to the present disclosure. The system 100 includes a first magnetic field sensing element 110 for a first channel aligned with the x-axis and a second magnetic field sensing element 112 for a second channel aligned with the y-axis. The first magnetic field sensing element 110 is expected to be at an angle of 90-degrees with respect to the second magnetic field sensing element 112 so that the magnetic field sensing elements 110, 112 are orthogonal with respect to each other.

The magnetic field projections $B_x$ and $B_y$ are amplified by gain 130, 140, converted into the digital domain by analog-to-digital converters (ADC) 132, 142, and the digital magnetic field signals $V_x^{(dig)}$ and $V_y^{(dig)}$ are used to calculate the magnetic field angle β by calculating the arctangent function of the digital magnetic field signals by a processor 135 such as a CORDIC processor.

Figure 3:
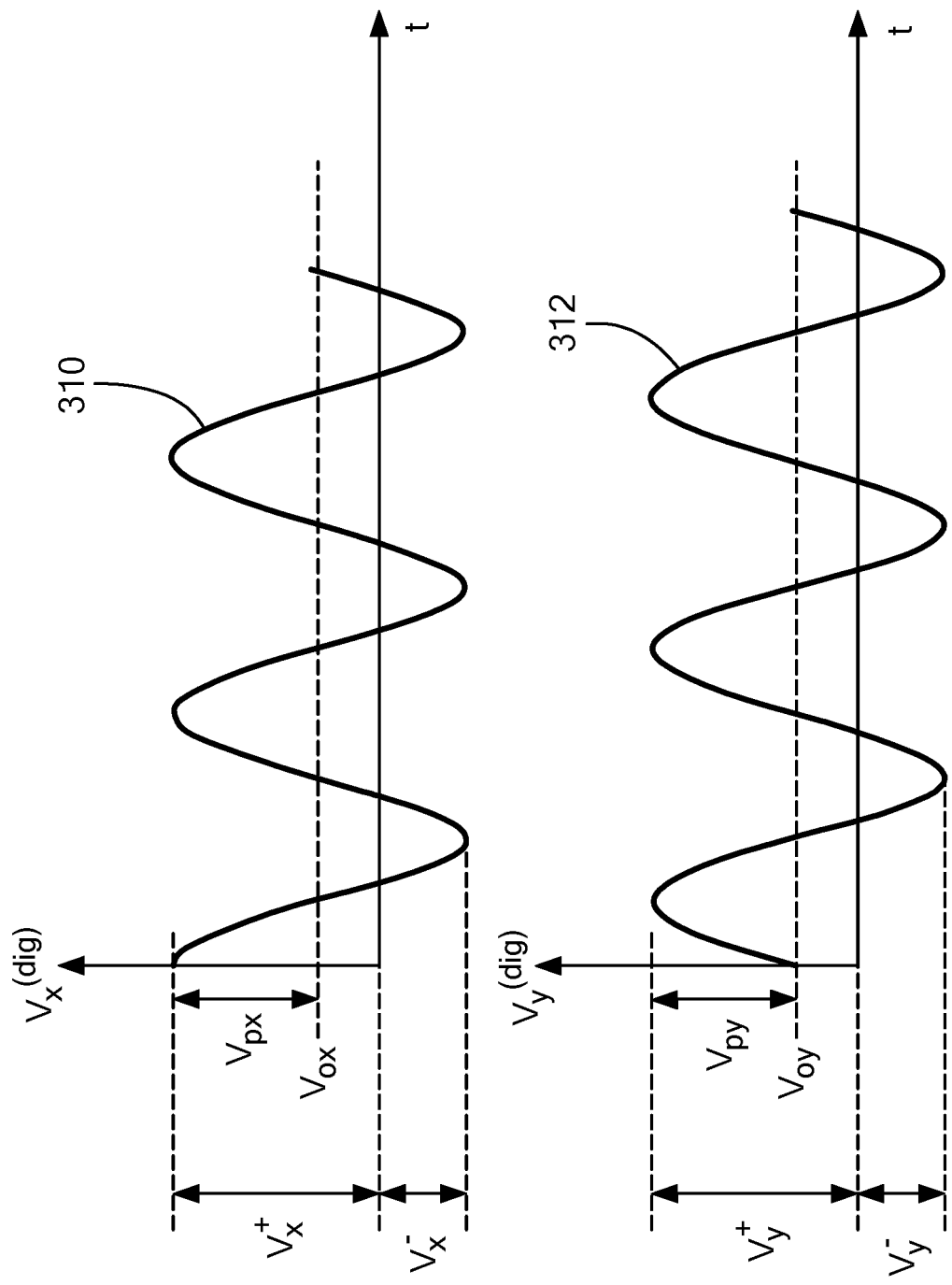
FIG. 3 is a graph showing a first channel signal waveform and a second channel signal waveform, according to an embodiment of the present disclosure.

Given that the sensing of the magnetic field B and the subsequent amplification and A/D conversion have non-idealities, the process can be modeled by the following equations Equation 1 and Equation 2, where $V_x^{(dig)}$ is the digital magnetic field signal input to the first input of the processor 135 and $V_y^{(dig)}$ is the digital magnetic field signal input to the second input of the processor 135:

$$V_x^{(dig)} = V_{p_x} \cos(\beta) + V_{o_x} \quad \text{Equation 1}$$

$$V_y^{(dig)} = V_{p_y} \sin(\beta - \theta) + V_{o_y} \quad \text{Equation 2}$$

where $V_{p_x}$ is the first channel (x-axis) peak voltage, $V_{p_y}$ is the second channel (y-axis) peak voltage, $V_{o_x}$ is the first channel (x-axis) residual offset after A/D conversion, and $V_{o_y}$ is the second channel (y-axis) residual offset after A/D conversion. Refer to FIG. 3 showing the sinusoidal waveform for the x-channel and y-channel $V_x^{(dig)}$ and $V_y^{(dig)}$. The associated peak and offset voltages are also shown.

Figure 2:
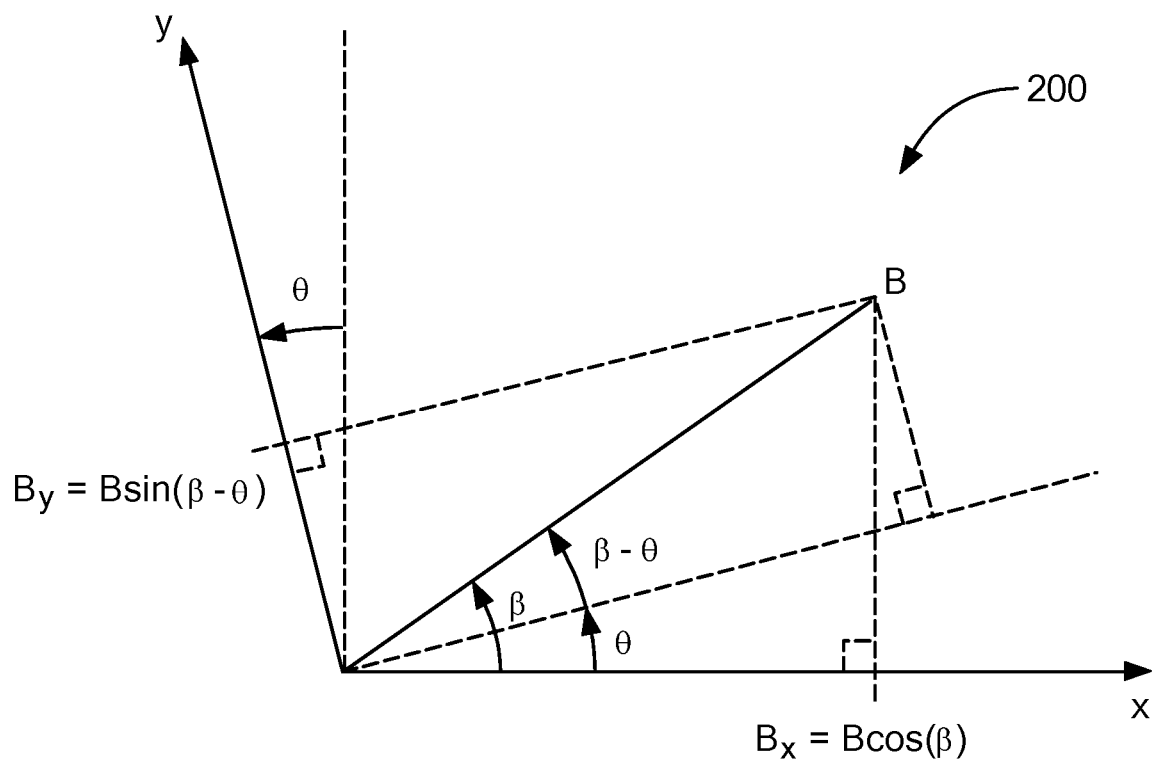
FIG. 2 is a graph showing a coordinate system associated with a magnetic field XY-based angle sensor having a first channel (e.g., x-axis) and a second channel (e.g., y-axis) and an example orthogonality error, according to the present disclosure.

FIG. 2 is a graphical diagram 200 showing the first channel and the second channel and associated orthogonality error, according to the present disclosure. The angle θ is representative of the non-orthogonality rotation of the Y axis as shown in FIG. 2. The angle of the magnetic field β is shown in FIG. 2 as the angle between the expected position of the x-channel and the expected position of the y-channel. The non-orthogonality rotation is representative of the difference between the expected angle between the two magnetic field sensing elements and the actual angle between the two magnetic field sensing elements.

The mismatch between the peak voltages $V_{p_x}$ and $V_{p_y}$ on each channel $V_x$ and $V_y$ depends on the sensitivities mismatch ($S_x$, $S_y$) of the transducer elements 110, 112 and the gain mismatch ($G_x$, $G_y$) of the amplifiers 130, 140 as shown in Equations 3 and 4:

$$V_{p_x} = B S_x G_x \quad \text{Equation 3}$$

$$V_{p_y} = B S_y G_y \quad \text{Equation 4}$$

To deal with non-idealities, offset voltages $V_{o_x}$ and $V_{o_y}$ must be removed, peak voltages $V_{p_x}$ and $V_{p_y}$ must be matched for each channel, and the non-orthogonality rotation θ must be also removed.

As described in greater detail below, a method to perform these non-idealities compensation is provided. In principle, it is based on the magnet continuously rotating but constant angular speed is not required.

As shown in FIG. 3, when the magnet is continuously rotating, the first (x-axis) and second (y-axis) channels produce sinusoidal waveforms including a first channel signal waveform 310 for the first channel $V_x$ and a second channel signal waveform 312 for the second channel $V_y$. Taking advantage of the continuous rotation of the magnet, the non-idealities compensation is performed according to the following orthogonality compensation techniques.

Figure 4:
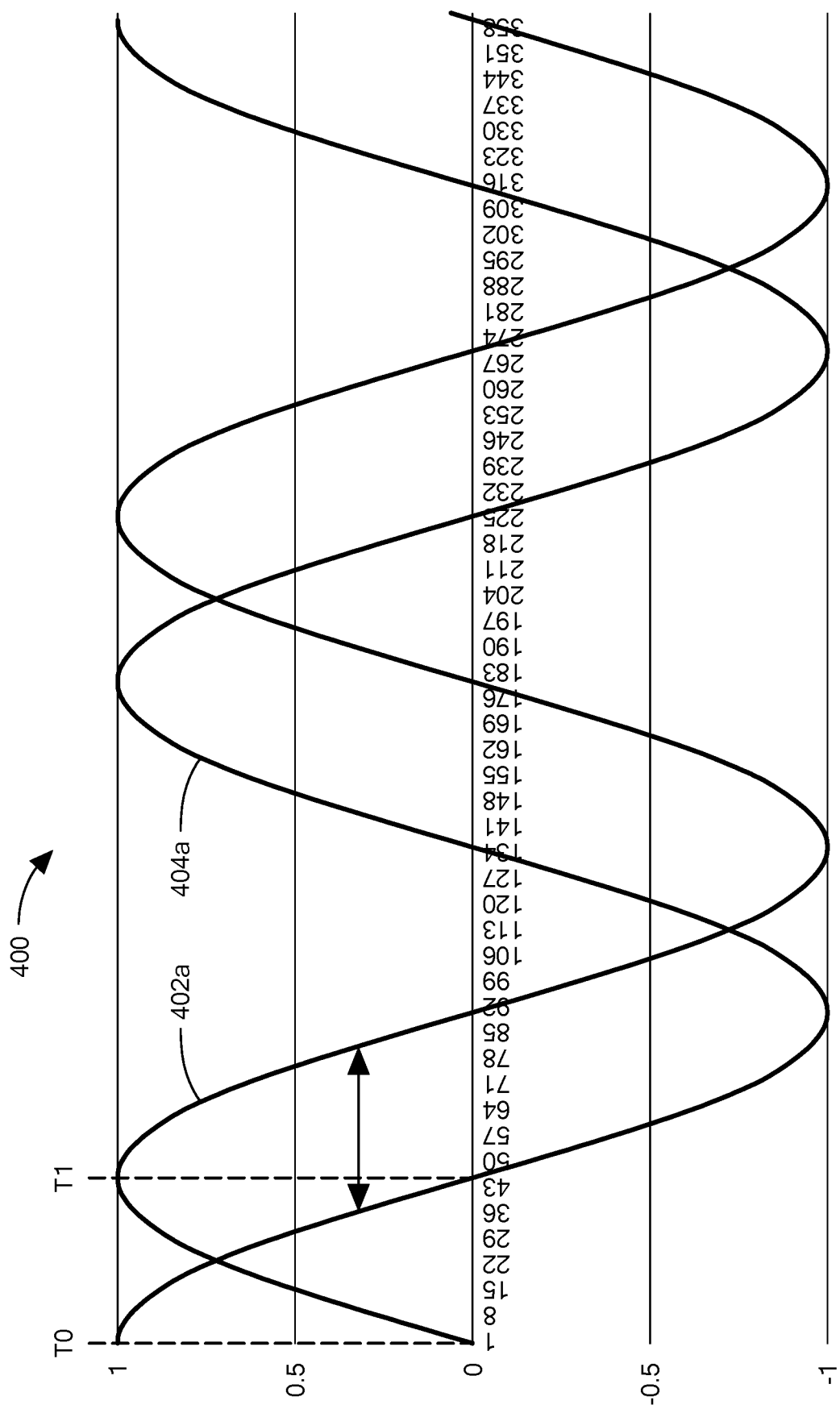
FIG. 4 is a graph of signals associated with FIG. 1.

FIG. 4 is a graphical diagram of signals associated with FIG. 1A. The graph 400 includes a horizontal axis representing the angle of the magnetic field detected by first and second magnetic field sensing elements (e.g., elements 2 and 4 in FIG. 1, or elements 110 and 112 in FIG. 2), and a vertical axis representing the strength of the magnetic field as detected by first and second magnetic field sensing elements. Signal 402a (the signal produced by first magnetic field sensing element 2 or 110) is shown as a sine wave and signal 404a (the signal produced by second magnetic field sensing element 4 or 112) is shown as a cosine wave. At point T0, the external magnetic field has a direction aligned with arrow 8 (see FIG. 1), so the value of signal 404a is high and the value of signal 402a is zero. At point T1, the external magnetic field has rotated so it has a direction aligned with arrow 6 (see FIG. 1), so the value of signal 402a is high and the value of signal 404a is zero. If there are errors in the alignment of magnetic field sensing elements 2 and/or 4 (or 110 and/or 112), signals 402a and 404a may not have a phase difference of exactly ninety degrees. In this situation, the misalignment may produce errors in the detected angle of the external magnetic field.

It will be appreciated that, for the first and second magnetic field sensing elements 2, 4 of FIG. 1 that are perfectly aligned to have maximum response axes that are at ninety degrees apart, a pointing direction of a magnetic field can be determined merely by calculating an arctangent of a ratio of the two signals 404a, 402a.

Figure 5:
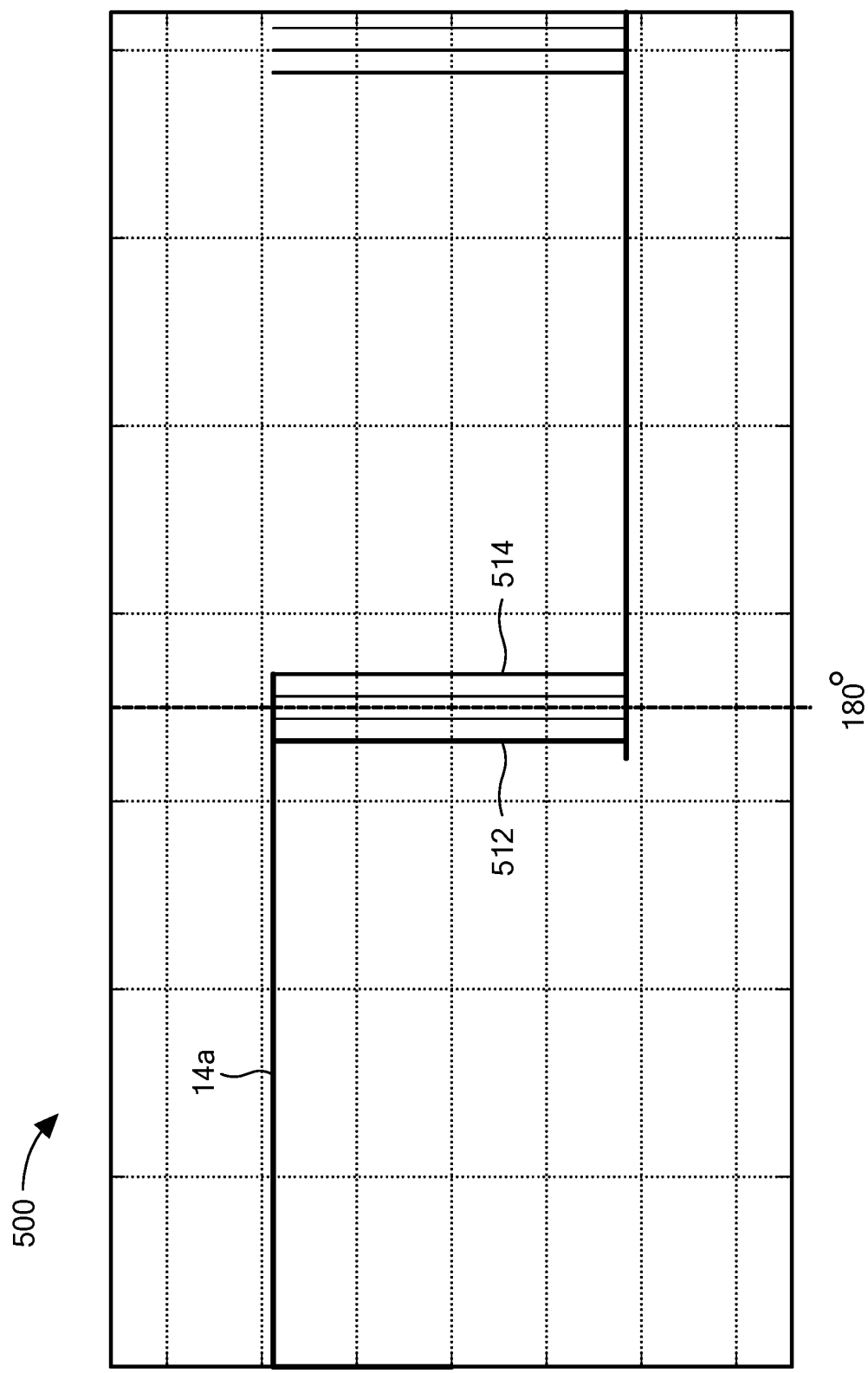
FIG. 5 is a graph of a first output signal of the magnetic field sensor of FIG. 1 or FIG. 1A.

FIG. 5 is a graph 500 of an example output signal 14a of processor 14 (see FIG. 1) during a calibration (e.g., during production) procedure. The horizontal axis refers to the angle of a reference magnetic field that may be used to calibrate magnetic field sensor 10. The vertical axis has a scale in units of volts in arbitrary units.

To compensate for orthogonality error, a constant value may be provided to one of the inputs of the processor 14, as described herein. For example, signal 2a and/or 11a may be replaced by a constant value while second magnetic field sensing element 3 detects the reference magnetic field. The reference magnetic field may be a rotating magnetic field having a known angle of rotation so that, when detected by magnetic field sensor 10, processor 14 can produce an output signal that deviated from an expected output signal. In an embodiment, the reference magnetic field may be produced by manufacturing test equipment during calibration of magnetic field sensor 10.

As the reference magnetic field rotates, it is desired that the output signal 14a of processor 14 transition at an expected value of magnetic field pointing direction, as shown in FIG. 5. In the example shown, if magnetic field sensor 4 is properly aligned, the expected transition of signal 14a may occur when the reference magnetic field has a direction of one hundred eighty degrees (180°). However, if magnetic field sensing element 4 is not properly aligned, the transition of signal 14a may occur before or after the one hundred eighty-degree mark, as shown by transitions 512 and 514, respectively. The difference between the actual transition and the expected transition at one hundred eighty degrees may be used to calculate an orthogonality error during calibration. The orthogonality error calculated during calibration can be used together with an orthogonality error calculated during operation of the magnetic field sensor, to account for orthogonality of the magnetic field sensor, in accordance with the techniques of the present disclosure.

Figure 6:
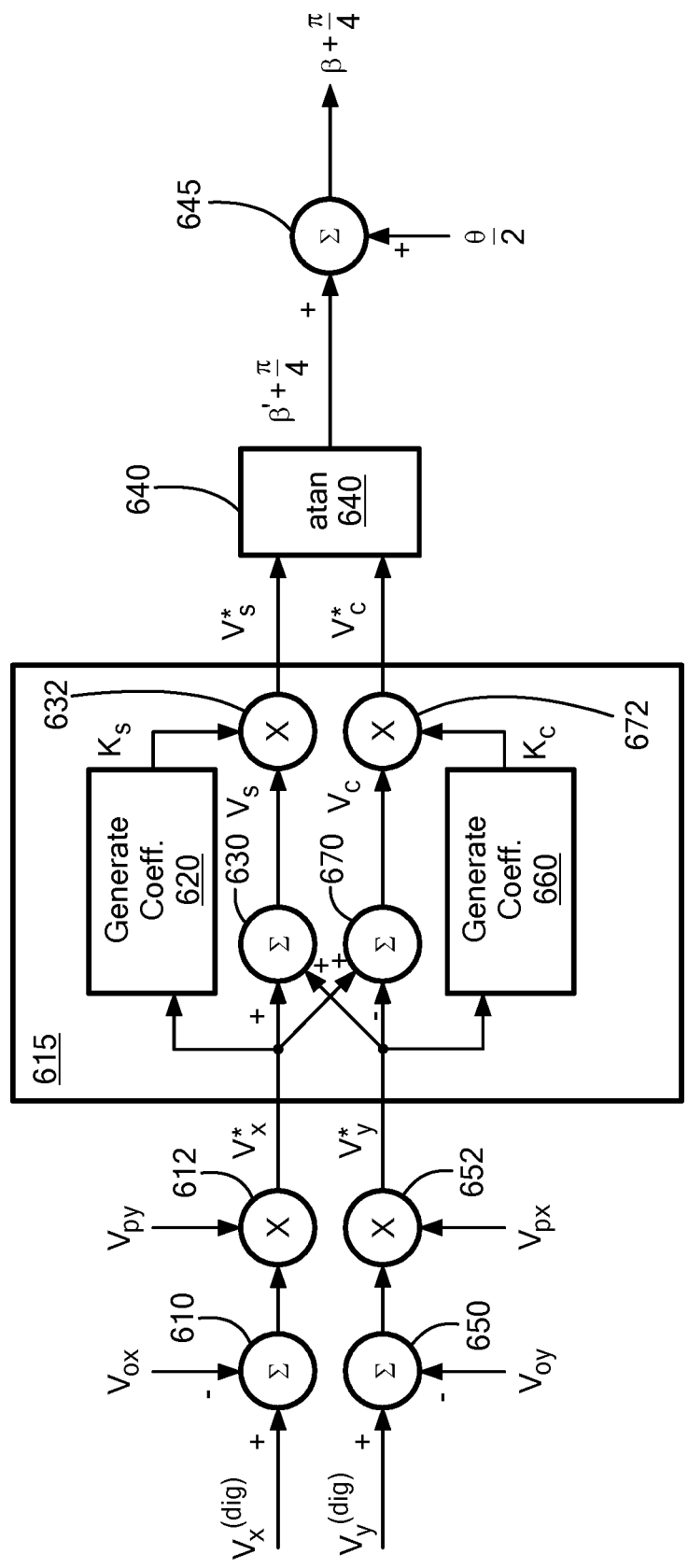
FIG. 6 is a block diagram of a magnetic field sensor for determining a magnetic field angle including circuitry for compensating for an orthogonality error in the magnetic field sensor, according to the present disclosure.

FIG. 6 is a block diagram of a magnetic field angle sensor including circuitry for compensating for an orthogonality error in the magnetic field sensor, according to the present disclosure. The magnetic field sensor includes a magnetic field sensing element for generating a first input signal ($V_x^{(dig)}$) and having a first axis of maximum sensitivity and a second magnetic field sensing element for generating a second input signal ($V_y^{(dig)}$) and having a second axis of maximum sensitivity. The magnetic field sensor includes one or more detectors (not shown in FIG. 6) that are applied to a first input signal on a first channel of a magnetic sensor (i.e., the output of a first magnetic field sensing element) and to a second input signal on a second channel of a magnetic sensor (i.e., the output of a second magnetic field sensing element). The magnetic field sensor can include at least one processor that receives an output of the one or more detectors and uses the output of the one or more detectors to calculate a first constant $K_C$ and a second constant $K_S$, and then uses the first constant $K_C$ and the second constant $K_S$ to compensate for an orthogonality error between the first axis of maximum sensitivity and the second axis of maximum sensitivity.

The non-idealities compensation begins by determining peak voltages $V_{p_x}$, $V_{p_y}$ and offset voltages $V_{o_x}$, $V_{o_y}$ in the magnetic field signal, using the $V_x$ and $V_y$ peak values (see, for example, FIG. 3 showing these values for the sinusoidal magnetic field signal), which peak and offset voltages are calculated according to Equations 5 through 8:

$$V_{o_x} = \frac{V_x^+ + V_x^-}{2} \quad \text{Equation 5}$$

$$V_{p_x} = \frac{V_x^+ - V_x^-}{2} \quad \text{Equation 6}$$

$$V_{o_y} = \frac{V_y^+ + V_y^-}{2} \quad \text{Equation 7}$$

$$V_{p_y} = \frac{V_y^+ - V_y^-}{2} \quad \text{Equation 8}$$

Let β' be defined as in Equation 9:

$$\beta' = \beta - \frac{\Theta}{2} \quad \text{Equation 9}$$

and then the magnetic field signal in each channel can be represented by the following equations:

$$V_x^{(dig)} = V_{p_x} \cos\left(\beta' + \frac{\Theta}{2}\right) + V_{o_x} \quad \text{Equation 10}$$

$$V_y^{(dig)} = V_{p_y} \sin\left(\beta' - \frac{\Theta}{2}\right) + V_{o_y} \quad \text{Equation 11}$$

With continued reference to FIG. 6, offsets can be removed, and peak voltages can be matched by the orthogonality error compensation element 615 implementing the following Equations 12 through 29:

$$V_x^* = V_{p_y}(V_x^{(dig)} - V_{o_x}) = V_{p_x} V_{p_y} \cos\left(\beta' + \frac{\Theta}{2}\right) \quad \text{Equation 12}$$

$$V_y^* = V_{p_x}(V_y^{(dig)} - V_{o_y}) = V_{p_x} V_{p_y} \sin\left(\beta' - \frac{\Theta}{2}\right) \quad \text{Equation 13}$$

Equation 12 provides a first gain and offset compensated signal $V_x^*$ at the output of multiplication element 612 and Equation 13 provides a second gain and offset compensated signal $V_y^*$ at the output of the multiplication element 652. At summation element 610, the offset voltage $V_{o_x}$ is subtracted from the digital magnetic field signal $V_x^{(dig)}$ for the first (x-axis) channel and likewise at summation element 650, the offset voltage $V_{o_y}$ is subtracted from the digital magnetic field signal $V_y^{(dig)}$ for the second (y-axis) channel. By multiplying the output of summation of elements 610, 650 by the respective peak of the opposite channel at multiplication elements 612, 652, the respective gain and offset compensated signal $V_x^*$ and $V_y^*$ are provided.

Adding and subtracting Equations 12 and 13 through cross-summation elements 630 and 670, the following quantities are obtained through Equations 14 and 15:

$$V_s = V_x^* + V_y^* = V_{p_x} V_{p_y} \left[\cos\left(\beta' + \frac{\Theta}{2}\right) + \sin\left(\beta' - \frac{\Theta}{2}\right)\right] \quad \text{Equation 14}$$

$$V_c = V_x^* - V_y^* = V_{p_x} V_{p_y} \left[\cos\left(\beta' + \frac{\Theta}{2}\right) - \sin\left(\beta' - \frac{\Theta}{2}\right)\right] \quad \text{Equation 15}$$

Equation 14 is used to solve for a first intermediate channel signal $V_s$ at the output of cross-summation element

630 and Equation 15 is used to solve for a second intermediate channel signal $V_c$ at the output of cross-summation element 670.

The trigonometric identify below in Equation 16 is known:

$$\cos(\alpha) = \sin\left(\alpha + \frac{\pi}{2}\right) \qquad \text{Equation 16}$$

and then, by replacing $\alpha$ with $$\beta' + \frac{\Theta}{2}$$

provides Equation 17:

$$\cos\left(\beta' + \frac{\Theta}{2}\right) = \sin\left(\beta' + \frac{\Theta}{2} + \frac{\pi}{2}\right) \qquad \text{Equation 17}$$

this yields Equations 18 and 19 below to solve for a first intermediate channel signal $V_s$ and a second intermediate channel signal $V_c$:

$$\begin{aligned} V_s = V_x^* + V_y^* &= V_{p_x}V_{p_y}\left[\sin\left(\beta' + \frac{\Theta}{2} + \frac{\pi}{2}\right) + \right. \\ &\quad \left. \sin\left(\beta' - \frac{\Theta}{2}\right)\right] \\ &= V_{p_x}V_{p_y}\left[\sin\left(\left(\beta' + \frac{\pi}{4}\right) + \left(\frac{\Theta}{2} + \frac{\pi}{4}\right)\right) + \right. \\ &\quad \left. \sin\left(\left(\beta' + \frac{\pi}{4}\right) - \left(\frac{\Theta}{2} + \frac{\pi}{4}\right)\right)\right] \end{aligned} \qquad \text{Equation 18}$$

$$\begin{aligned} V_c = V_x^* - V_y^* &= V_{p_x}V_{p_y}\left[\sin\left(\beta' + \frac{\Theta}{2} + \frac{\pi}{2}\right) - \right. \\ &\quad \left. \sin\left(\beta' - \frac{\Theta}{2}\right)\right] \\ &= V_{p_x}V_{p_y}\left[\sin\left(\left(\beta' + \frac{\pi}{4}\right) + \left(\frac{\Theta}{2} + \frac{\pi}{4}\right)\right) - \right. \\ &\quad \left. \sin\left(\left(\beta' + \frac{\pi}{4}\right) - \left(\frac{\Theta}{2} + \frac{\pi}{4}\right)\right)\right] \end{aligned} \qquad \text{Equation 19}$$

By applying the following trigonometric identities in Equations 20 and 21:

$$2\sin(a)\cos(b) = \sin(a+b) + \sin(a-b) \qquad \text{Equation 20}$$

$$2\cos(a)\sin(b) = \sin(a+b) - \sin(a-b) \qquad \text{Equation 21}$$

one can arrive at the following Equations 22 and 23:

$$V_s = \qquad \text{Equation 22}$$

$$2V_{p_x}V_{p_y}\left[\sin\left(\beta' + \frac{\pi}{4}\right)\cos\left(\frac{\Theta}{2} + \frac{\pi}{4}\right)\right] = 2V_{p_x}V_{p_y}K_c\sin\left(\beta' + \frac{\pi}{4}\right)$$

$$V_c = \qquad \text{Equation 23}$$

$$2V_{p_x}V_{p_y}\left[\cos\left(\beta' + \frac{\pi}{4}\right)\sin\left(\frac{\Theta}{2} + \frac{\pi}{4}\right)\right] = 2V_{p_x}V_{p_y}K_s\cos\left(\beta' + \frac{\pi}{4}\right)$$

Where the constants $K_c$ and $K_s$ can be defined as:

$$K_c = \cos\left(\frac{\Theta}{2} + \frac{\pi}{4}\right) \qquad \text{Equation 24}$$

$$K_s = \sin\left(\frac{\Theta}{2} + \frac{\pi}{4}\right) \qquad \text{Equation 25}$$

A first orthogonality compensated signal $V_s^*$ and a second orthogonality compensated signal $V_c^*$ can be determined by multiplying, respectively, $K_s$ with $V_s$ and $K_c$ with $V_c$, at multiplication elements 632, 672, respectively, as shown in Equations 26 and 27 below:

$$V_s^* = K_sV_s = 2V_{p_x}V_{p_y}K_cK_s\sin\left(\beta' + \frac{\pi}{4}\right) \qquad \text{Equation 26}$$

$$V_c^* = K_cV_c = 2V_{p_x}V_{p_y}K_cK_s\cos\left(\beta' + \frac{\pi}{4}\right) \qquad \text{Equation 27}$$

Then, by taking the arctangent of the first orthogonality compensated signal $V_s^*$ as compared to the second orthogonality compensated signal $V_c^*$, by the processor 640, as shown in Equation 28 below, the value of $$\beta' + \frac{\pi}{4}$$

can be obtained at the output of processor 640.

$$\beta' + \frac{\pi}{4} = \operatorname{atan}\left(\frac{V_s^*}{V_c^*}\right) \qquad \text{Equation 28}$$

Finally, by cross-summing with $$\frac{\Theta}{2}$$

(e.g., at cross-summation element 645) then $$\beta + \frac{\pi}{4}$$

can be solved for, and by subtracting $$\frac{\pi}{4}$$

from both sides of the equation, one arrives at Equation 29 below to solve for $\beta$.

$$\beta = \operatorname{atan}\left(\frac{V_s^*}{V_c^*}\right) + \frac{\Theta}{2} - \frac{\pi}{4} \qquad \text{Equation 29}$$

Now, the pending calculation is to obtain the angle $\theta$ of non-orthogonality rotation.

It will be appreciated that if the offset and gain compensated signal $V_x^*$ is zero (i.e., the sinusoidal signal is located at the zero-crossing) as shown in Equation 30:

$$V_x^* = V_{P_x}V_{P_y}\cos\left(\beta' + \frac{\Theta}{2}\right) = 0 \quad \text{Equation 30}$$

then $$\beta' + \frac{\theta}{2}$$

is equal to $$\frac{\pi}{2}$$

if the offset and gain compensated signal $V_y^*$ is greater than 0 and $$\beta' + \frac{\theta}{2}$$

is equal to $$-\frac{\pi}{2}$$

if the offset and gain compensated signal $V_y^*$ is less than 0, as shown in Equation 31 below:

$$\beta' + \frac{\Theta}{2} = \begin{cases} \frac{\pi}{2}, & V_y^* > 0 \\ -\frac{\pi}{2}, & V_y^* < 0 \end{cases} \quad \text{Equation 31}$$

and thus $\beta'$ is equal to $$\frac{\pi}{2} - \frac{\Theta}{2}$$

if the offset and gain compensated signal $V_y^*$ is greater than zero and $\beta'$ is equal to $$-\frac{\pi}{2} - \frac{\Theta}{2}$$

if the offset and gain compensated signal $V_y^*$ is less than zero, as shown in Equation 32 below:

$$\beta' = \begin{cases} \frac{\pi}{2} - \frac{\Theta}{2}, & V_y^* > 0 \\ -\frac{\pi}{2} - \frac{\Theta}{2}, & V_y^* < 0 \end{cases} \quad \text{Equation 32}$$

this yields the following possible outcomes for $V_y^*$ in Equation 33:

$$V_y^* = \quad \text{Equation 33}$$

$$V_{P_x}V_{P_y}\sin\left(\beta' - \frac{\Theta}{2}\right) = \begin{cases} V_{P_x}V_{P_y}\sin(\frac{\pi}{2} - \Theta), & V_y^* > 0 \\ V_{P_x}V_{P_y}\sin(-\frac{\pi}{2} - \Theta), & V_y^* < 0 \end{cases} =$$

$$\begin{cases} V_{P_x}V_{P_y}\cos(\Theta), & V_y^* > 0 \\ -V_{P_x}V_{P_y}\cos(\Theta), & V_y^* < 0 \end{cases}$$

Likewise, if the input signal or gain compensated signal $V_y^*$ is zero (the sinusoidal signal is located at the zero-crossing) as shown in Equation 34:

$$V_y^* = V_{P_x}V_{P_y}\sin\left(\beta' - \frac{\Theta}{2}\right) = 0 \quad \text{Equation 34}$$

then $$\beta' - \frac{\Theta}{2}$$

is equal to zero if the offset and gain compensated signal $V_x^*$ is greater than zero and $$\beta' - \frac{\Theta}{2}$$

is equal to $\pi$ when the offset and gain compensated signal $V_x^*$ is less than zero, as shown in Equation 35:

$$\beta' - \frac{\Theta}{2} = \begin{cases} 0, & V_x^* > 0 \\ \pi, & V_x^* < 0 \end{cases} \quad \text{Equation 35}$$

and thus $\beta'$ is equal to $$\frac{\Theta}{2}$$

when the offset and gain compensated signal $V_x^*$ is greater than zero and $\beta'$ is equal to $$\pi + \frac{\Theta}{2}$$

when the offset and gain compensated signal $V_x^*$ is less than zero as shown in Equation 36:

$$\beta' = \begin{cases} \frac{\Theta}{2}, & V_x^* > 0 \\ \pi + \frac{\Theta}{2}, & V_x^* < 0 \end{cases} \quad \text{Equation 36}$$

this yields the following possible outcomes for the offset and gain compensated signal $V_x^*$ in Equation 37:

$$V_x^* = V_{p_x} V_{p_y} \cos\left(\beta' + \frac{\Theta}{2}\right) = \begin{cases} V_{p_x} V_{p_y} \cos(\Theta), & V_x^* > 0 \\ -V_{p_x} V_{p_y} \cos(\Theta), & V_x^* < 0 \end{cases} =$$
$$\begin{cases} V_{p_x} V_{p_y} \cos(\Theta), & V_x^* > 0 \\ -V_{p_x} V_{p_y} \cos(\Theta), & V_x^* < 0 \end{cases}$$

Equation 37

It will be appreciated that if the offset and gain compensated signal $V_x^*$ is equal to the peak of the x channel multiplied by the peak of the y channel, as shown in Equation 38:

$$V_x^* = V_{p_x} V_{p_y} \cos\left(\beta' + \frac{\Theta}{2}\right) = \begin{cases} V_{p_x} V_{p_y} \\ -V_{p_x} V_{p_y} \end{cases}$$

Equation 38 then $$\beta' + \frac{\Theta}{2}$$

is equal to zero if $V_x^*$ is greater than zero and $$\beta' + \frac{\Theta}{2}$$

is equal to $\pi$ if $V_x^*$ is less than zero, as shown in Equation 39:

$$\beta' + \frac{\Theta}{2} = \begin{cases} 0, & V_x^* > 0 \\ \pi, & V_x^* < 0 \end{cases}$$

Equation 39 and thus $\beta'$ is equal to $$-\frac{\Theta}{2}$$

if $V_x^*$ is greater than zero and $\beta'$ is equal to $$\pi - \frac{\Theta}{2}$$

if $V_x^*$ is less than zero, as shown in Equation 40:

$$\beta' = \begin{cases} -\frac{\Theta}{2}, & V_x^* > 0 \\ \pi - \frac{\Theta}{2}, & V_x^* < 0 \end{cases}$$

Equation 40 this yields the following possible outcomes for $V_y^*$ in Equation 41:

$$V_y^* = V_{p_x} V_{p_y} \sin\left(\beta' - \frac{\Theta}{2}\right) =$$

Equation 41

-continued $$\begin{cases} V_{p_x} V_{p_y} \sin(-\Theta), & V_x^* = V_{p_x} V_{p_y} \\ V_{p_x} V_{p_y} \sin(\pi - \Theta), & V_x^* = -V_{p_x} V_{p_y} \end{cases} =$$
$$\begin{cases} -V_{p_x} V_{p_y} \sin(\Theta), & V_x^* = V_{p_x} V_{p_y} \\ V_{p_x} V_{p_y} \sin(\Theta), & V_x^* = -V_{p_x} V_{p_y} \end{cases}$$

Likewise, it will be appreciated that if the offset and gain compensated signal $V_x^*$ is equal to the peak of the x channel multiplied by the peak of the y channel, as shown in Equation 42:

$$V_y^* = V_{p_x} V_{p_y} \sin\left(\beta' - \frac{\Theta}{2}\right) = \begin{cases} V_{p_x} V_{p_y} \\ -V_{p_x} V_{p_y} \end{cases}$$

Equation 42 then $$\beta' - \frac{\Theta}{2}$$

is equal to $$\frac{\pi}{2}$$

when the second offset and gain compensated signal $V_y^*$ is greater than zero, and $$\beta' - \frac{\Theta}{2}$$

is equal to $$-\frac{\pi}{2}$$

when the second offset and gain compensated signal $V_y^*$ is less than zero, as shown in Equation 43:

$$\beta' - \frac{\Theta}{2} = \begin{cases} \frac{\pi}{2}, & V_y^* > 0 \\ -\frac{\pi}{2}, & V_y^* < 0 \end{cases}$$

Equation 43 and thus $\beta'$ is equal to $$\frac{\pi}{2} + \frac{\Theta}{2}$$

when the second offset and gain compensated signal $V_y^*$ is greater than zero and $\beta'$ is equal to $$-\frac{\pi}{2} + \frac{\Theta}{2}$$

when the second offset and gain compensated signal $V_y^*$ is less than zero, as shown in Equation 44:

$$\beta' = \begin{cases} \dfrac{\pi}{2} + \dfrac{\Theta}{2}, & V_y^* > 0 \\ -\dfrac{\pi}{2} + \dfrac{\Theta}{2}, & V_y^* < 0 \end{cases} \qquad \text{Equation 44}$$

this yields the following possible outcomes for $V_x^*$ in Equation 45:

$$V_x^* = V_{p_x} V_{p_y} \cos\left(\beta' + \dfrac{\Theta}{2}\right) = \qquad \text{Equation 45}$$

$$\begin{cases} V_{p_x} V_{p_y} \cos\left(\dfrac{\pi}{2} + \Theta\right), & V_y^* = V_{p_x} V_{p_y} \\ V_{p_x} V_{p_y} \cos\left(-\dfrac{\pi}{2} + \Theta\right), & V_y^* = -V_{p_x} V_{p_y} \end{cases} =$$

$$\begin{cases} -V_{p_x} V_{p_y} \sin(\Theta), & V_y^* = V_{p_x} V_{p_y} \\ V_{p_x} V_{p_y} \sin(\Theta), & V_y^* = -V_{p_x} V_{p_y} \end{cases}$$

The possible outcomes for the first offset and gain compensated signal $V_x^*$ and the second offset and gain compensated signal $V_y^*$, and corresponding equations for calculating θ, as provided by Equations 33, 37, 41, and 45, are summarized below in Table 1.

TABLE 1

Conditions over $V^*_x$ and $V^*_y$ for calculating Θ.

| | |
|---|---|
| $V^*_x = 0$ | $V^*_y = V_{p_x}V_{p_y}\cos(\Theta)$ |
| | $V^*_y = -V_{p_x}V_{p_y}\cos(\Theta)$ |
| $V^*_y = 0$ | $V^*_x = V_{p_x}V_{p_y}\cos(\Theta)$ |
| | $V^*_x = -V_{p_x}V_{p_y}\cos(\Theta)$ |
| $V^*_x = V_{p_x}V_{p_y}$ | $V^*_y = -V_{p_x}V_{p_y}\sin(\Theta)$ |
| $V^*_x = -V_{p_x}V_{p_y}$ | $V^*_y = V_{p_x}V_{p_y}\sin(\Theta)$ |
| $V^*_y = V_{p_x}V_{p_y}$ | $V^*_x = -V_{p_x}V_{p_y}\sin(\Theta)$ |
| $V^*_y = -V_{p_x}V_{p_y}$ | $V^*_x = V_{p_x}V_{p_y}\sin(\Theta)$ |

Figure 8A:
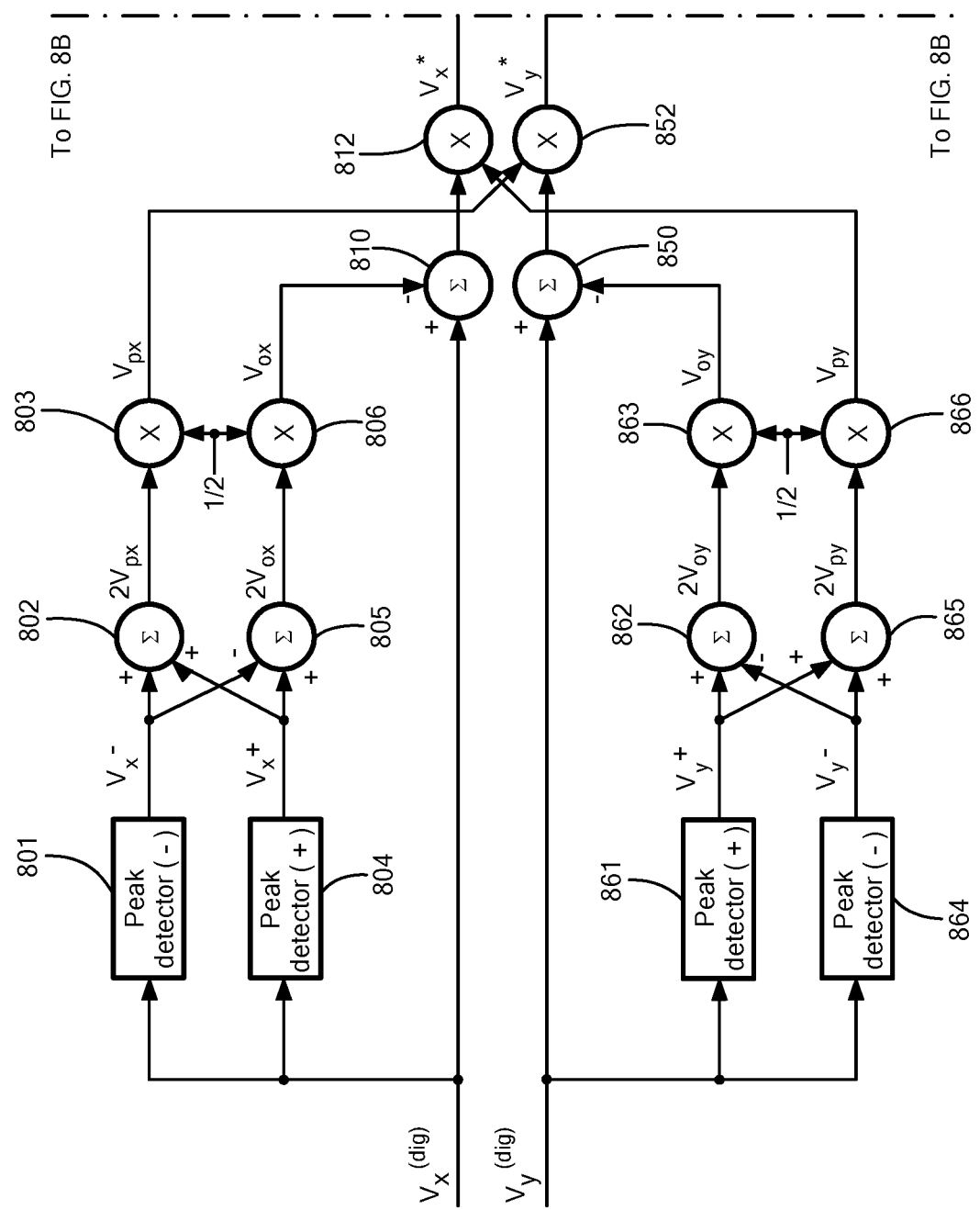
FIGS. 8A-8B is a block diagram of another magnetic field sensor for determining a magnetic field angle including circuitry for compensating for an orthogonality error in the magnetic field sensor, implementing zero-detector and peak-detectors that are applied to the gain-compensated signals, according to the present disclosure.
Figure 8B:
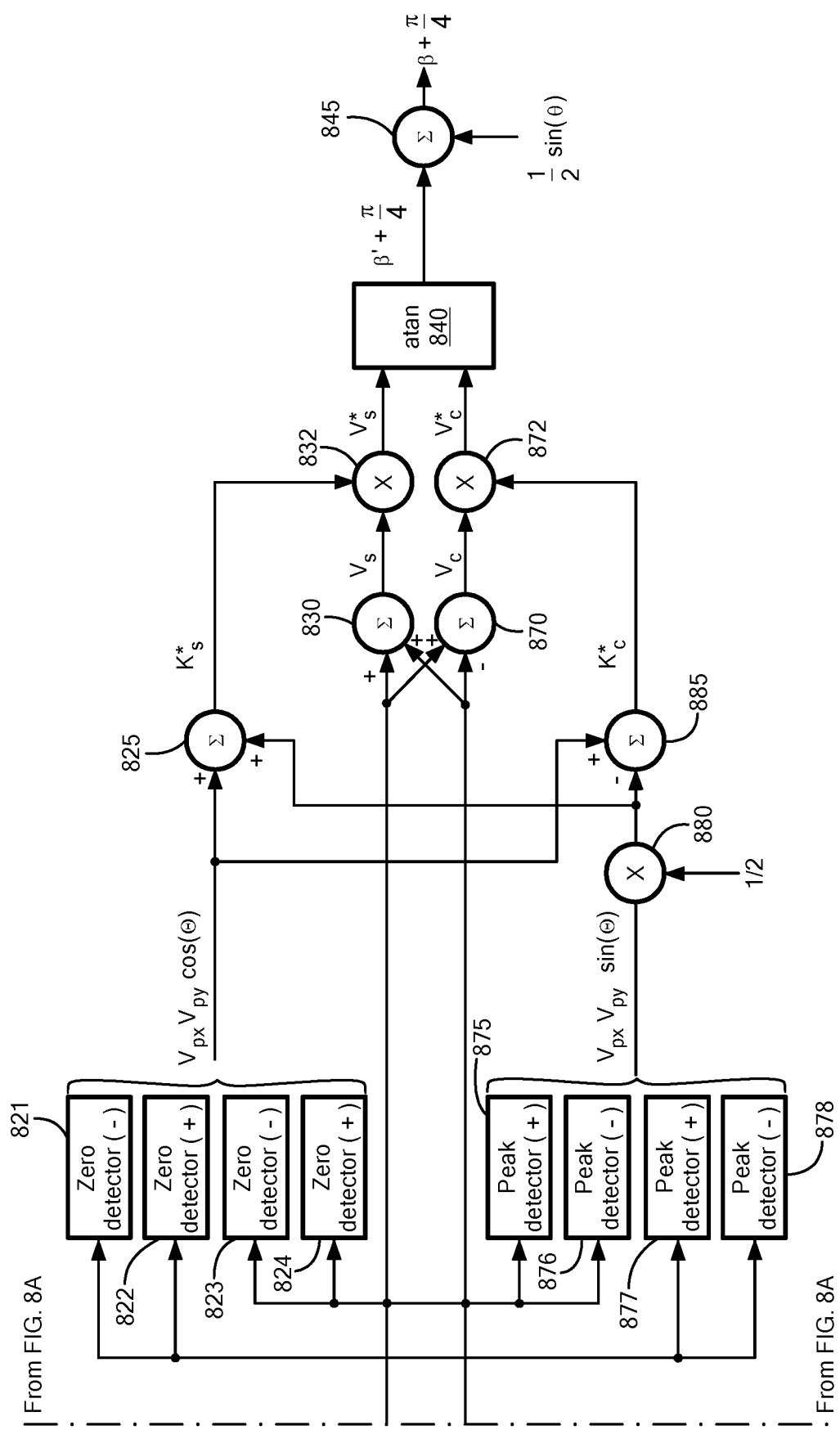

It will be appreciated that by monitoring the first offset and gain compensated signal $V_x^*$ and the second offset and gain compensated signal $V_y^*$ (by means of peak and zero detectors as described in greater detail with respect to FIGS. 8A-8B), the value of θ, and therefore $K_c$ and $K_s$ can be generated at 620 and 660.

A practical way to find $K_c$ and $K_s$ from values in Table 1 in order to minimize hardware operations is as follows with reference to FIG. 7. It is based on some approximations provided that the loss of accuracy is acceptable for the application.

Figure 7:
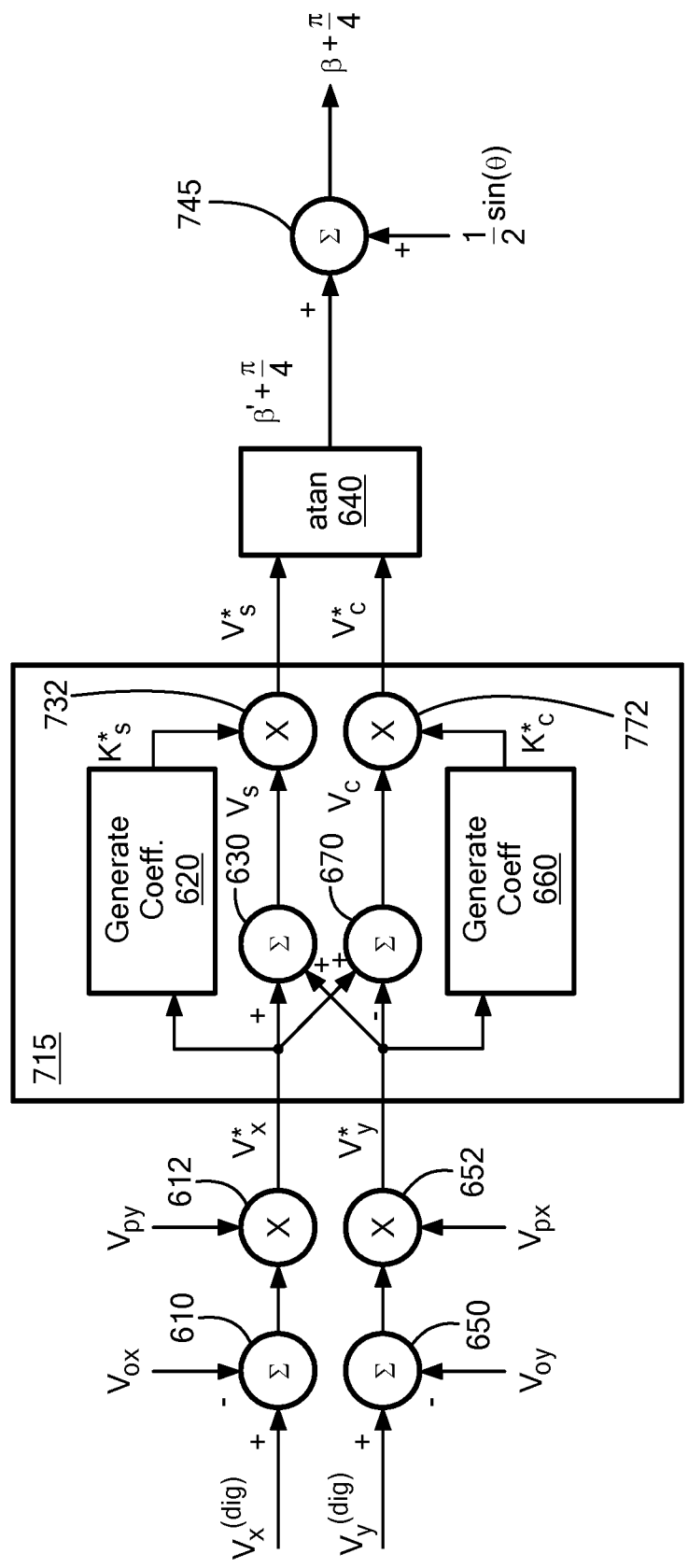
FIG. 7 is a block diagram of another magnetic field sensor for determining a magnetic field angle including circuitry for compensating for an orthogonality error in the magnetic field sensor, according to the present disclosure.

FIG. 7 is a block diagram of another magnetic field sensor for measuring a magnetic field including circuitry for compensating for an orthogonality error in the magnetic field sensor, according to the present disclosure.

The following known trigonometric identities in Equations 46 and 47 can be used to solve for $K_c$ and $K_s$:

$$\cos(a \pm b) = \cos(a)\cos(b) \mp \sin(a)\sin(b) \qquad \text{Equation 46}$$

$$\sin(a \pm b) = \sin(a)\cos(b) \pm \cos(a)\sin(b) \qquad \text{Equation 47}$$

and then it follows that:

$$K_c = \cos\left(\dfrac{\Theta}{2} + \dfrac{\pi}{4}\right) = \qquad \text{Equation 48}$$

$$\cos\left(\dfrac{\Theta}{2}\right)\cos\left(\dfrac{\pi}{4}\right) - \sin\left(\dfrac{\Theta}{2}\right)\sin\left(\dfrac{\pi}{4}\right) = \dfrac{1}{\sqrt{2}}\left[\cos\left(\dfrac{\Theta}{2}\right) - \sin\left(\dfrac{\Theta}{2}\right)\right]$$

$$K_s = \sin\left(\dfrac{\Theta}{2} + \dfrac{\pi}{4}\right) = \qquad \text{Equation 49}$$

$$\sin\left(\dfrac{\Theta}{2}\right)\cos\left(\dfrac{\pi}{4}\right) + \cos\left(\dfrac{\Theta}{2}\right)\sin\left(\dfrac{\pi}{4}\right) = \dfrac{1}{\sqrt{2}}\left[\sin\left(\dfrac{\Theta}{2}\right) + \cos\left(\dfrac{\Theta}{2}\right)\right]$$

Considering $$\cos\left(\dfrac{\Theta}{2}\right) \cong \cos(\Theta) \text{ and } \sin\left(\dfrac{\Theta}{2}\right) \cong \dfrac{1}{2}\sin(\Theta)$$

(this will be only valid if the loss of accuracy is acceptable for the application). Whether the loss is considered acceptable for the application varies with each application. For some applications, the error equations can use the approximations, for example, in Equations 50 and 51 below. Another example approximation can be to subtract the real magnetic angle from the corrected value with the approximation. Then $K_c$ and $K_s$ can be approximated as shown in Equations 50 and 51:

$$K_c \cong \dfrac{1}{\sqrt{2}}\left[\cos(\Theta) - \dfrac{1}{2}\sin(\Theta)\right] \qquad \text{Equation 50}$$

$$K_s \cong \dfrac{1}{\sqrt{2}}\left[\cos(\Theta) + \dfrac{1}{2}\sin(\Theta)\right] \qquad \text{Equation 51}$$

Let $K_c^*$ and $K_s^*$ be represented below in Equations 52 and 53, according to the approximation in FIG. 7, where $K_c^*$ is an approximation of the constant $K_s$ based on Equation 51 and is the input to multiplication element 732 and $K_s^*$ is an approximation of the constant $K_c$ based on Equation 50 and is the input to multiplication element 772, as shown approximated in Equations 52 and 53:

$$K_c^* = \sqrt{2}\,V_{p_x}V_{p_y}K_c \cong V_{p_x}V_{p_y}\left[\cos(\Theta) - \dfrac{1}{2}\sin(\Theta)\right] \qquad \text{Equation 52}$$

$$K_s^* = \sqrt{2}\,V_{p_x}V_{p_y}K_s \cong V_{p_x}V_{p_y}\left[\cos(\Theta) + \dfrac{1}{2}\sin(\Theta)\right] \qquad \text{Equation 53}$$

FIG. 7 shows the final implementation when this approximation ($K_s^*$ and $K_c^*$) is used. Peak detectors over $V_x^{(dig)}$ and $V_y^{(dig)}$ must be implemented to get $V_{o_x}$, $V_{o_y}$, $V_{p_x}$ and $V_{p_y}$ and also peak detectors and zero-crossing detectors over $V_x^*$ and $V_y^*$ to calculate $K_c^*$ and $K_s^*$ by element 715. Note that the peak and zero-crossing detectors not shown in FIG. 7—refer to FIGS. 8 and 9 for example, showing various peak and zero-crossing detectors. In addition, in the system of FIG. 7, θ/2 has been approximated by sin(θ)/2 for the summation element 745. Finally, the π/4 angle shift can be treated as part of the mechanical angle misalignment.

In such a case, a first intermediate channel signal $V_s^*$ and a second intermediate channel signal $V_c^*$ will correspond to the multiplication of $K_s^* V_s$ and $K_c^* V_c$, respectively, as shown in Equations 54 and 55, which are, respectively, the outputs of multiplication elements 732 and 772:

$$V_s^* = K_s^* V_s = 2V_{p_x} V_{p_y} K_c K_s^* \sin\left(\beta' + \frac{\pi}{4}\right) \quad \text{Equation 54}$$

$$V_c^* = K_c^* V_c = 2V_{p_x} V_{p_y} K_c^* K_s \cos\left(\beta' + \frac{\pi}{4}\right) \quad \text{Equation 55}$$

FIGS. 8A-8B show a block diagram of another magnetic field sensor for measuring a magnetic field including circuitry for compensating for an orthogonality error in the magnetic field sensor, implementing zero-detector and peak-detectors that are applied to the gain-compensated signals, according to the present disclosure. Although the block diagram and various embodiments herein disclose removing offset and gain mismatch from input magnetic field signals, and then implementing zero-detectors and peak-detectors that are applied to the gain and offset-compensated signals, it will be appreciated that the zero-detectors and peak-detectors herein can be applicable to signals received that have already have the gain mismatch and offset compensated for.

As shown in FIGS. 8A-8B, $V_x^{(dig)}$ is digital magnetic field signal input to the first input of the processor and $V_y^{(dig)}$ is the digital magnetic field signal input to the second input of the processor. A negative peak detector 801 can be implemented to detect the negative peak in the digital magnetic field signal $V_x^{(dig)}$ for the x channel and a positive peak detector 804 can be implemented to detect the positive peak in the digital magnetic field signal $V_x^{(dig)}$ for the x channel which are cross-summed at summation elements 802, 805, respectively, to produce $2V_{p_x}$ and $2V_{o_x}$. At multiplication elements 803, 806, the values $2V_{p_x}$ and $2V_{o_x}$ are multiplied by ½ to arrive at $V_{p_x}$ and $V_{o_x}$. A positive peak detector 861 can be implemented to detect the positive peak value in the digital magnetic field signal $V_y^{(dig)}$ for the y channel and a negative peak detector 864 can be implemented to detect the negative peak in the digital magnetic field signal $V_y^{(dig)}$ for the y channel which are cross-summed at summation elements 862, 865, respectively, to produce $2V_{o_y}$ and $2V_{p_y}$. At multiplication elements 863, 866, the values $2V_{o_y}$ and $2V_{p_y}$ are multiplied by ½ to arrive at $V_{o_y}$ and $V_{p_y}$. The offset voltage $V_{o_x}$ is subtracted from the digital magnetic field signal $V_x^{(dig)}$ at summation element 810, and then multiplied by the peak for the opposing channel ($V_{p_y}$) at multiplication element 812 to provide the offset and gain compensated signal $V_x^*$. The offset voltage $V_{o_y}$ is added to the digital magnetic field signal $V_y^{(dig)}$ at summation element 850, and then multiplied by the peak for the opposing channel ($V_{p_x}$) at multiplication element 852 to provide the offset and gain compensated signal $V_y^*$.

One or more detectors are applied to the offset and gain compensated signal (or other appropriate input signal) and an output of the one or more detectors is used to calculate a first constant ($K_c$) and a second constant ($K_s$) that are each a function of the orthogonality error. The first constant $K_c$ and the second constant $K_s$ are used to compensate for the orthogonality error between the first channel and the second channel of the magnetic field sensor.

The detectors can include a plurality of zero-crossing, or zero detectors and a plurality of peak detectors to account for and compensate for any orthogonality error. A "negative" (i.e., on the falling edge) zero detector 821 determines the zero-crossing for the $V_x^*$ signal on the falling edge of the signal, a "positive" (i.e., on the rising edge) zero detector 822 determines the zero-crossing for the $V_x^*$ signal on the rising edge of the signal, a negative zero detector 823 determines the zero-crossing for the $V_y^*$ signal on the falling edge of the signal, and a positive zero detector 824 determines the zero-crossing for the $V_y^*$ signal on the falling edge of the signal. A positive peak detector 875 can be used to determine a positive peak value in the $V_y^*$ signal, a negative peak detector 876 can be used to determine a negative peak value in the $V_y^*$ signal, a positive peak detector 877 can be used to determine a positive peak value in the $V_x^*$ signal, and a negative peak detector 878 can be used to determine a negative peak value in the $V_x^*$ signal. Table 1 can be used to provide an approximation of $V_{p_x} V_{p_y} \cos(\theta)$ using the zero detectors 821, 822, 823, 824, and an approximation $V_{p_x} V_{p_y} \sin(\theta)$ using the peak detectors 875, 876, 877, 878. The multiplication element 880 is to multiply the peak detectors by half and the channels are cross-summed at cross-summation elements 825, 885 to arrive at approximated constants $K_s^*$ and $K_c^*$ according to the equations described in greater detail herein regarding FIG. 6. The offset and gain compensated signal is cross-summed by 830, 870 to provide the intermediate channel signals $V_s$ and $V_c$ which are multiplied by the constants $K_s^*$ and $K_c^*$ respectively, at 832 and 872 to provide first and second orthogonality compensated signals $V_s^*$ and $V_c^*$ that are provided to processor 840. By taking the arctangent at 840 and the summing with ½ sin $(\theta)$ at 845, the angle β of the magnetic field can be determined.

The peak detectors can be configured to compare the output of the first input signal or the second input signal to a threshold value, and wherein the threshold value comprises a predetermined value that is determined to be a peak for the first input signal or the second input signal. The processor comprises one or more of a CORDIC processor, a look-up table, or a polynomial approximator.

It will be appreciated that the first input signal ($V_x^{(dig)}$) and the second input signal ($V_y^{(dig)}$) are received at substantially the same time in the normal operation orthogonality compensation techniques. In particular, and in contrast with a production environment in which one input may be nulled at a time and thus only one input signal is thus analyzed at a time, in the embodiment of FIGS. 8A-8B and other embodiments that occur during normal operation, both signals are received at substantially the same time.

Figure 9A:
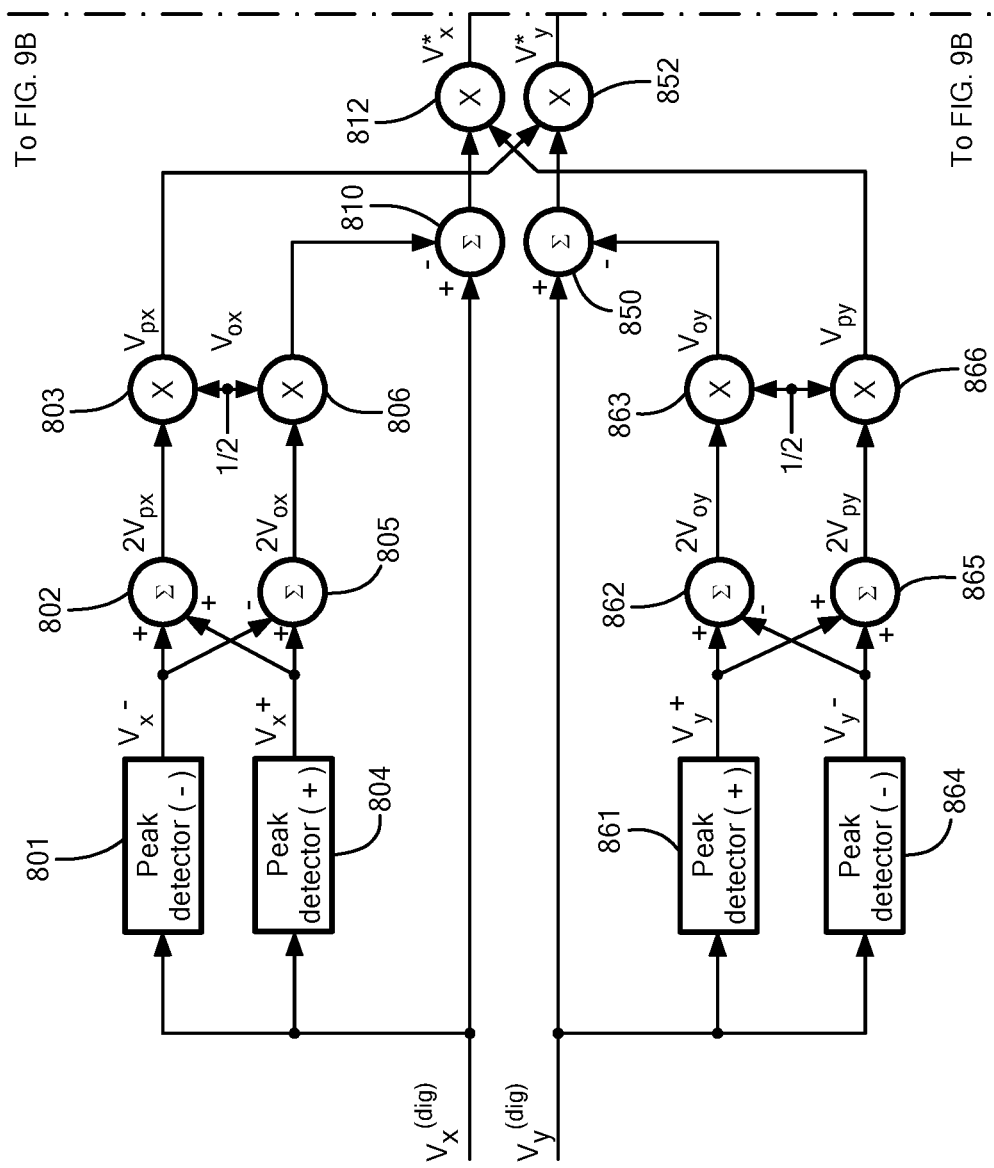
FIGS. 9A-9B is a block diagram of another magnetic field sensor for determining a magnetic field angle including circuitry for compensating for an orthogonality error in the magnetic field sensor, implementing peak detectors that are applied to the gain-compensated signals, according to the present disclosure.
Figure 9B:
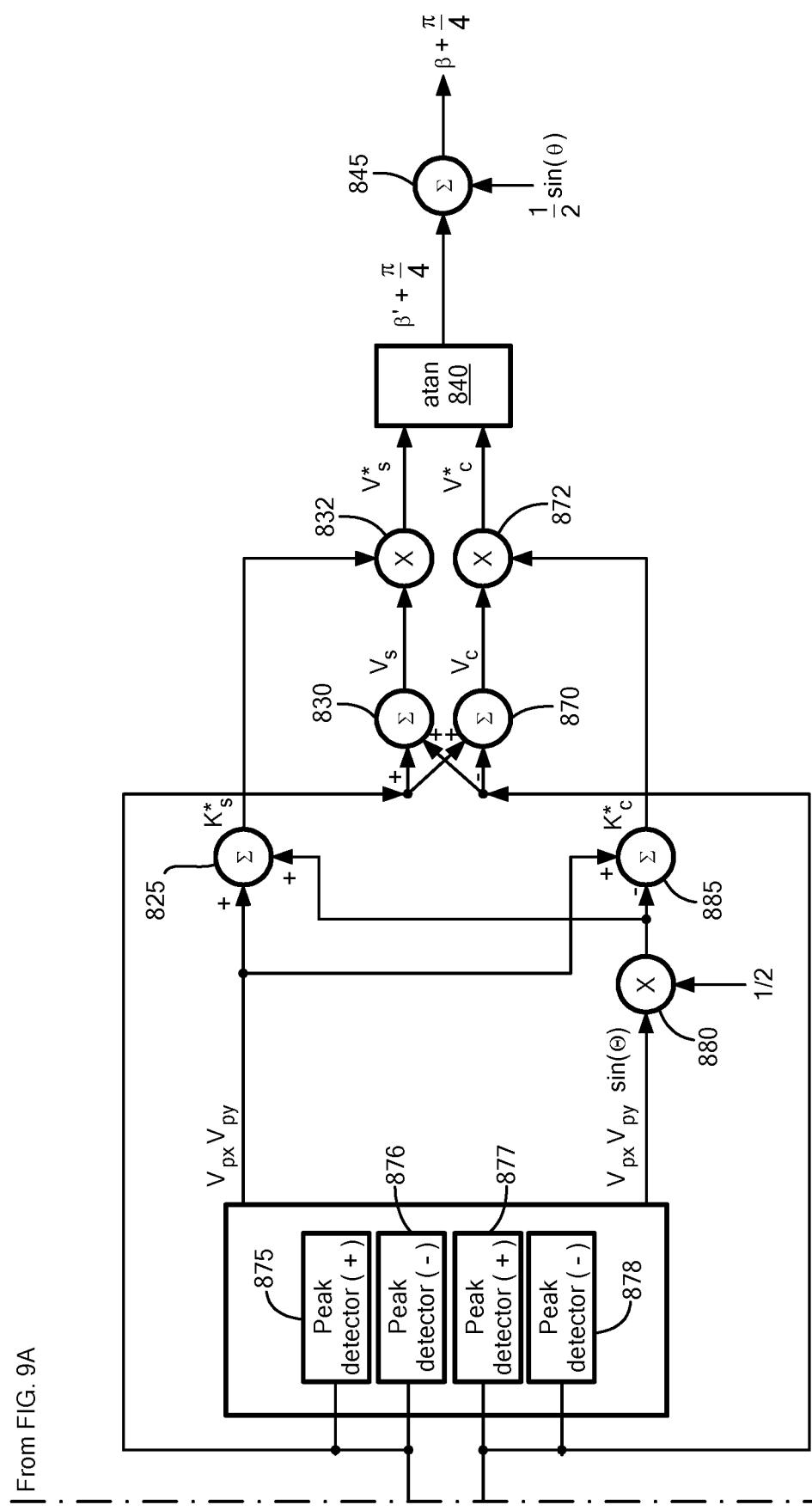

Another useful approximation to consider is that $$\cos\left(\frac{\Theta}{2}\right) \cong 1$$

and then Equations 50, 51, 52, and 53 can be approximated as follows for $K_c$, $K_s$, $K_c^*$ and $K_s^*$ in Equations 56, 57, 58 and 59:

$$K_c \cong \frac{1}{\sqrt{2}}\left[1 - \frac{1}{2}\sin(\Theta)\right] \quad \text{Equation 56}$$

$$K_s \cong \frac{1}{\sqrt{2}}\left[1 + \frac{1}{2}\sin(\Theta)\right] \quad \text{Equation 57}$$

$$K_c^* \cong V_{p_x} V_{p_y}\left[1 - \frac{1}{2}\sin(\Theta)\right] \quad \text{Equation 58}$$

$$K_s^* \cong V_{p_x} V_{p_y}\left[1 + \frac{1}{2}\sin(\Theta)\right] \quad \text{Equation 59}$$

which reduces the hardware complexity since only peak detectors are needed over $V_x^*$ and $V_y^*$ saving zero detectors, as shown in FIGS. 9A-9B. It will be appreciated that the magnetic field sensor of FIGS. 9A-9B has the same processing as FIGS. 8A-8B, except that the zero detectors (821, 822, 823, 824) are removed and the processing is slightly more streamlined using the approximation and Equations 56 through 59.

The accuracy error is by doing the last approximation will then be:

$$\beta \cong \beta^* = \operatorname{atan}\left(\frac{2V_{P_x}V_{P_y}K_c^*K_s^*\sin\left(\beta' + \frac{\pi}{4}\right)}{2V_{P_x}V_{P_y}K_c^*K_s^*\cos\left(\beta' + \frac{\pi}{4}\right)}\right) + \frac{1}{2}\sin(\Theta) - \frac{\pi}{4} \quad \text{Equation 60}$$

$$\varepsilon_\beta = \beta - \beta^* = \quad \text{Equation 61}$$

$$\beta - \operatorname{atan}\left(\frac{2V_{P_x}V_{P_y}K_c^*K_s^*\sin\left(\beta' + \frac{\pi}{4}\right)}{2V_{P_x}V_{P_y}K_c^*K_s^*\cos\left(\beta' + \frac{\pi}{4}\right)}\right) - \frac{1}{2}\sin(\Theta) + \frac{\pi}{4}$$

Given a maximum value of non-orthogonality $\Theta_{MAX}$, the maximum error over β will be:

$$\varepsilon_\beta = \quad \text{Equation 62}$$

$$\beta - \beta^* = \beta - \operatorname{atan}\left(\frac{2V_{P_x}V_{P_y}K_{c\_MAX}^*K_{s\_MAX}^*\sin\left(\beta' + \frac{\pi}{4}\right)}{2V_{P_x}V_{P_y}K_{c\_MAX}^*K_{s\_MAX}^*\cos\left(\beta' + \frac{\pi}{4}\right)}\right) -$$

$$\frac{1}{2}\sin(\Theta_{MAX}) + \frac{\pi}{4}$$

Where $$K_{c_{MAX}} = \cos\left(\frac{\Theta_{MAX}}{2} + \frac{\pi}{4}\right) \quad \text{Equation 63}$$

$$K_{s\_MAX} = \sin\left(\frac{\Theta_{MAX}}{2} + \frac{\pi}{4}\right) \quad \text{Equation 64}$$

$$K_{c\_MAX}^* \cong V_{P_x}V_{P_y}\left[1 - \frac{1}{2}\sin(\Theta_{MAX})\right] \quad \text{Equation 65}$$

$$K_{s\_MAX}^* \cong V_{P_x}V_{P_y}\left[1 + \frac{1}{2}\sin(\Theta_{MAX})\right] \quad \text{Equation 66}$$

The circuitry of the present disclosure compensates for the orthogonality error in the magnetic field sensor during normal operation of the magnetic field sensor without any knowledge of the orthogonality error nor the magnetic field angle. The orthogonality error is compensated as it drifts due to ambient conditions, aging, or other factors. It will be appreciated that the orthogonality error compensation techniques (e.g., as shown in FIGS. 8A-8B and FIGS. 9A-9B) may be combined with other techniques for removing orthogonality error and gain/offset mismatches during production. Although specific techniques for detecting zero-crossings and/or peaks may be disclosed herein, it will be appreciated that any system or method for detecting peaks and/or zero-crossings may be implemented. In an embodiment, detected values of $K_c^*$ and $K_s^*$ could be averaged by any appropriate averaging means to obtain an improved estimation of $K_c$ and $K_s$ that are used in determining the orthogonality error.

Figure 10:
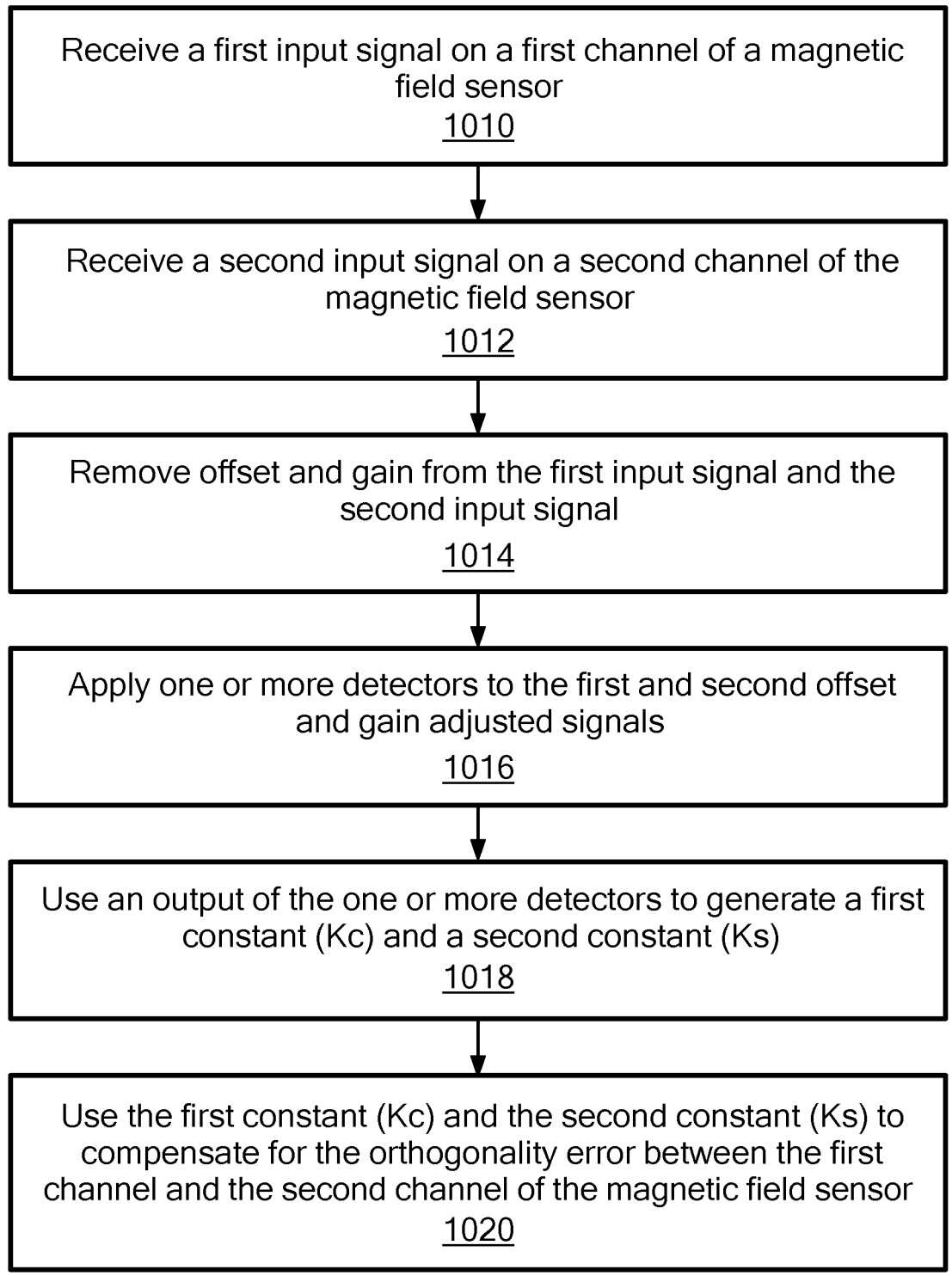
FIG. 10 is a flow chart of a method for determining an orthogonality error of a magnetic field sensor, according to the present disclosure.

FIG. 10 is a flow chart of a method for determining an orthogonality error of a magnetic field sensor, according to the present disclosure. At block 1010, a first input signal is received on a first channel of a magnetic field sensor. This can be, for example, signal 2a or 11a in FIG. 1 or $V_x^{(dig)}$ in FIG. 1A.

At block 1012, a second input signal is received on a second channel of a magnetic field sensor. This can be, for example, signal 4a or 12a in FIG. 1, or $V_y^{(dig)}$ in FIG. 1A.

At block 1014, offset and gain are removed from the first input signal and the second input signal. The offset and can, for example, be removed by the summation element 610, multiplication element 612, summation element 650, and multiplication element 652 collectively to arrive at the offset and gain compensated signals $V_x^*$ and $V_y^*$.

At block 1016, one or more detectors are applied to the first and second offset and gain adjusted signals. The detectors can comprise one or more peak detectors and/or zero detectors, as will be appreciated in light of the present disclosure.

At block 1018, an output of the one or more detectors is used to generate a first constant ($K_c$) and a second constant ($K_s$). Refer, for example, to FIG. 6 and the generation of first constant $K_c$ and second constant $K_s$, or FIG. 7 showing the generation of an approximation of the first constant $K_c^*$ and an approximation of the second constant $K_s^*$.

At block 1020, the first constant ($K_c$) and the second constant ($K_s$) are used to compensate for any orthogonality error between the first channel and the second channel of the magnetic field sensor. Using the first constant and the second constant to compensate for the orthogonality error can include cross-summing the first offset and gain compensated signal ($V_x^*$) with the second offset and gain compensated signal ($V_y^*$) to generate a first intermediate channel signal $V_s$ and a second intermediate channel signal $V_c$, as shown in FIG. 6 for example, and then multiplying the first and second intermediate channel signals $V_s$, $V_c$ by an approximation $K_s^*$, $K_c^*$ of the first and second constants $K_s$, $K_c$ to generate first and second orthogonality compensated signals $V_s^*$, $V_c^*$, for example as shown in FIG. 7.

Figure 11:
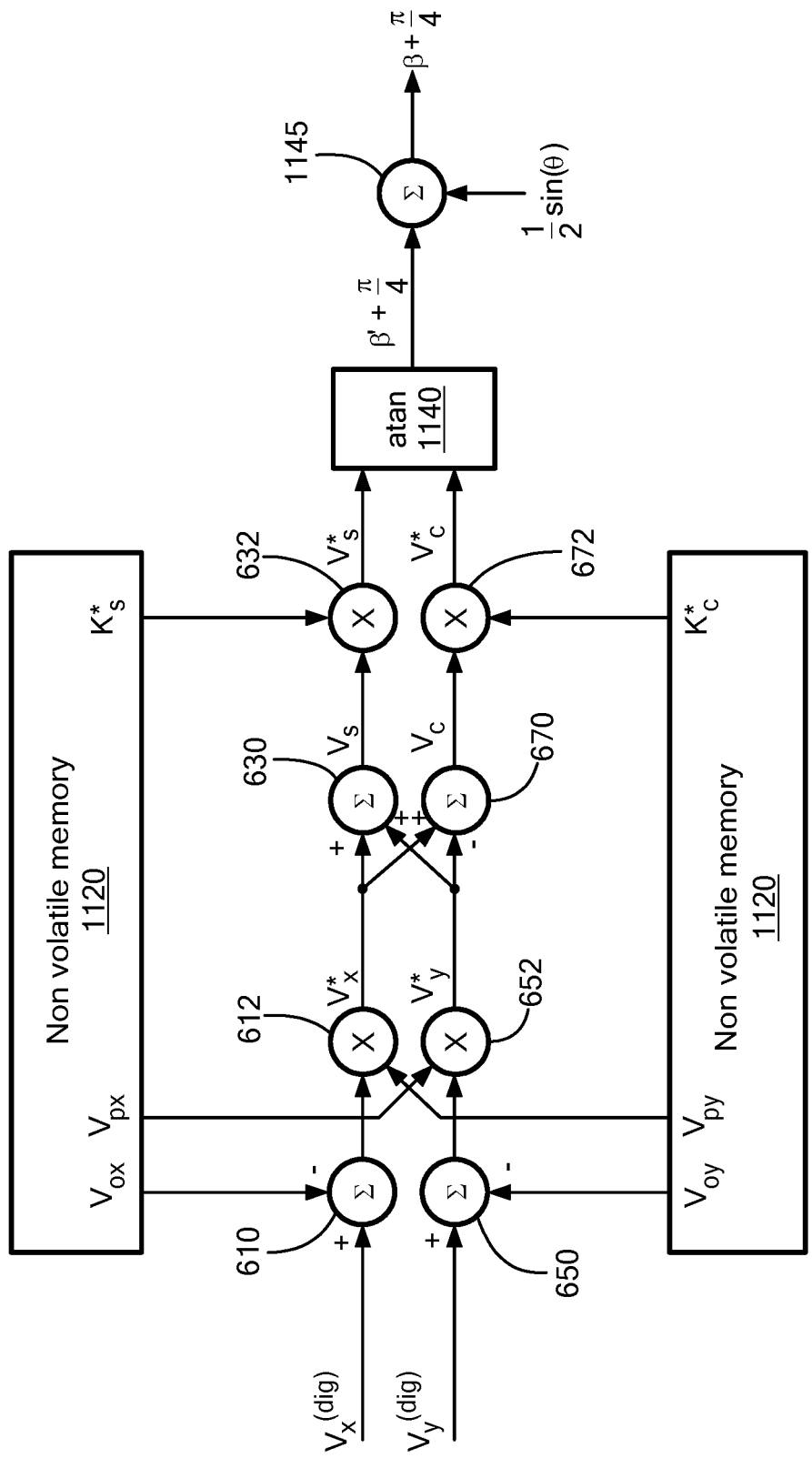
FIG. 11 is a block diagram of another magnetic field sensor for determining a magnetic field angle including circuitry for compensating for an orthogonality error and further including memory for storing constants associated with the orthogonality error, according to the present disclosure.

FIG. 11 is a block diagram of another magnetic field sensor for measuring a magnetic field including circuitry for compensating for an orthogonality error and including memory for storing constants associated with the orthogonality error, according to the present disclosure. As shown in FIG. 11, the architecture is primarily the same as FIG. 7, except that a memory is included to store values for $V_{o_x}$, $V_{o_y}$, $V_{p_x}$, $V_{p_y}$, $K_s^*$, and $K_c^*$. These values can be determined during a production environment (i.e., prior to normal operation of the magnetic field sensor) to compensate for these values and can provide a baseline for determining the orthogonality error during normal operation of the magnetic field sensor.

The orthogonality techniques of the present disclosure can further include storing the first constant ($K_c$) and the second constant ($K_s$) in a memory coupled to the magnetic field sensor. This method could be implemented as a calibration procedure during production phase. By giving a full turn of the magnet (e.g., magnet 120 in FIG. 1A) in a production testbench, peaks and zeros crossings can be detected over voltage signals $V_x^{(dig)}$ and $V_y^{(dig)}$ by the measuring equipment to offline calculate offset and peak values ($V_{o_x}$, $V_{o_y}$, $V_{p_x}$, $V_{p_y}$). Then, by removing offset and compensating gain mismatch to $V_x^{(dig)}$ and $V_y^{(dig)}$, another full turn of the magnet will allow to calculate $K_s^*$ and $K_c^*$ coefficients by detecting peaks and zero crossing over the offset and gain mismatch compensated signals.

In such a case, $V_{o_x}$, $V_{o_y}$, $V_{p_x}$, $V_{p_y}$, $K_s^*$ and $K_c^*$ could be stored inside the device in non-volatile memory 1120 (ROM, EEPROM, FLASH, fuses, etc.) allowing to compensate offset, gain mismatch and non-orthogonality in the production conditions (which is typically room conditions). The processor 1140 utilizes the equations hereinabove (e.g., Equation 28) to solve for $$\beta' + \frac{\pi}{4}$$

and summation element 1145 utilizes an equation (e.g., Equation 29) to solve for $$\beta' + \frac{\pi}{4}.$$

The system of FIG. 11 can be implemented during production to set the trimming coefficients $V_{o_x}$, $V_{o_y}$, $V_{p_x}$, $V_{p_y}$, $K_s^*$ and $K_c^*$ at room conditions, and then when the device is powered up in the real environment, autocalibration circuitry can work on top of the preset trimming.

It will be appreciated that some embodiments of orthogonality compensation that are performed during normal operation of the magnetic field sensor can be combined with an embodiment that sets one of the inputs to a constant value to determine $K_c$ and $K_s$ during the production environment. Such a method can include setting a first input signal at a first input of a processor to a constant value during a first time period and during the first time period, measuring a first transition at an output of the processor. The method can include setting a second input signal at a second input of a processor to the constant value during a second time period different than the first time period and during the second time period, measuring a second transition at the output of the processor. A deviation between the first transition and the second transition from respective expected transitions of the output signal of the processor are used to calculate $K_c$ and $K_s$ during a first time period. The method can then continue with receiving a first input signal on a first channel of the magnetic field sensor during a third time period different than the first time period and different than the second time period and receiving a second input signal on a second channel of the magnetic field sensor during the third time period. The method includes applying one or more detectors to the first input signal and the second input signal receiving during the third time period; and then using an output of the one or more detectors and the deviation between the first transition and the second transition from respective expected transitions of the output signal of the processor to calculate a first constant ($K_c$) and a second constant ($K_s$), wherein each of the first constant ($K_c$) and the second constant ($K_s$) is a function of the orthogonality error. The method finalizes by compensating for the orthogonality error between the first channel and the second channel of the magnetic field sensor using the first constant ($K_c$) and the second constant ($K_s$). The first time period is non-overlapping with the second time period, the second time period is non-overlapping with the third time period, and the first time period is non-overlapping with the third time period.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture or production of the circuit.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method of determining an orthogonality error of a magnetic field sensor, the method comprising:
    receiving a first input signal on a first channel of the magnetic field sensor;
    receiving a second input signal on a second channel of the magnetic field sensor;
    removing offset and gain from the first input signal and the second input signal to generate a first offset and gain compensated signal and a second offset and gain compensated signal;
    applying one or more zero-crossing detectors to the first and second offset and gain compensated signals;
    applying one or more peak detectors to the first and second offset and gain compensated signals;
    using an output of the one or more zero-crossing detectors and the one or more peak detectors to calculate a first constant and a second constant, wherein each of the first constant and the second constant is a function of the orthogonality error; and
    using the first constant and the second constant to compensate for the orthogonality error between the first channel and the second channel of the magnetic field sensor.

2. The method of claim 1, wherein the first input signal and the second input signal are received at substantially the same time.

3. The method of claim 1, wherein the first input signal and the second input signal are magnetic field signals indicative of a magnetic field affected by a target proximate the magnetic field sensor.

4. The method of claim 1, wherein applying the one or more zero-crossing detectors to the first and second offset and gain compensated signals comprises:
    applying a first zero-crossing detector to the first offset and gain compensated signal to identify a first zero-crossing point in the first offset and gain compensated signal;
    applying a second zero-crossing detector to the first offset and gain compensated signal to identify a second zero-crossing point in the first offset and gain compensated signal;
    applying a third zero-crossing detector to the second offset and gain compensated signal to identify a first zero-crossing point in the second offset and gain compensated signal; and
    applying a fourth zero-crossing detector to the second offset and gain compensated signal to identify a second zero-crossing point in the second offset and gain compensated signal.

5. The method of claim 1, wherein applying the one or more peak detectors to the first and second offset and gain compensated signals comprises:
applying a first peak detector to the first offset and gain compensated signal to identify a positive peak value in the first offset and gain compensated signal;
applying a second peak detector to the first offset and gain compensated signal to identify a negative peak value in the first offset and gain compensated signal;
applying a third peak detector to the second offset and gain compensated signal to identify a positive peak value in the second offset and gain compensated signal; and
applying a fourth peak detector to the second offset and gain compensated signal to identify a negative peak value in the second offset and gain compensated signal.

6. The method of claim 1, wherein using the first constant and the second constant to compensate for the orthogonality error between the first channel and the second channel of the magnetic field sensor comprises:
cross-summing the first offset and gain compensated signal with the second offset and gain compensated signal to generate a first intermediate channel signal and a second intermediate channel signal;
multiplying the first intermediate channel signal by a first approximation of the first constant to generate a first orthogonality compensated signal; and
multiplying the second intermediate channel signal by a second approximation of the second constant to generate a second orthogonality compensated signal.

7. The method of claim 1, further comprising, prior to receiving the first input signal on the first channel of the magnetic field sensor:
setting the first input signal at a first input of a processor to a constant value;
during the setting of the first input signal, measuring a first transition at an output of the processor;
setting the second input signal at a second input of a processor to the constant value;
during the setting of the second input signal, measuring a second transition at the output of the processor; and
using a deviation between the first transition and the second transition from respective expected transitions of the output signal of the processor to calculate the first constant and the second constant.

8. The method of claim 7, wherein the first input signal is set to the constant value during a first time period, and the second input signal is set to the constant value during a second time period different than the first time period.

9. A method of determining an orthogonality error of a magnetic field sensor, the method comprising:
receiving a first input signal on a first channel of the magnetic field sensor;
receiving a second input signal on a second channel of the magnetic field sensor;
applying one or more detectors to the first input signal and the second input signal;
using an output of the one or more detectors to calculate a first constant and a second constant, wherein each of the first constant and the second constant is a function of the orthogonality error; and
using the first constant and the second constant to compensate for the orthogonality error between the first channel and the second channel of the magnetic field sensor.

10. The method of claim 9, wherein the one or more detectors comprise one or more peak detectors, wherein the one or more peak detectors are configured to compare the output of the first input signal or the second input signal to a threshold value, and wherein the threshold value comprises a predetermined value that is determine to be a peak for the first input signal or the second input signal.

11. The method of claim 10, wherein the one or more detectors includes one or more zero-crossing detectors, and wherein the threshold value comprises zero to determine the zero-crossing values of the first input signal or the second input signal.

12. The method of claim 9, wherein the one or more detectors comprise one or more peak detectors, and wherein applying the one or more peak detectors to the first input signal and the second input signal comprises:
applying a first peak detector to the first input signal to identify a positive peak value in the first input signal;
applying a second peak detector to the first input signal to identify a negative peak value in the first input signal;
applying a third peak detector to the second input signal to identify a positive peak value in the second input signal; and
applying a fourth peak detector to the second input signal to identify a negative peak value in the second input signal.

13. The method of claim 9, wherein the one or more detectors comprise one or more zero-crossing detectors, wherein applying the one or more zero-crossing detectors to the first input signal and the second input signal comprises:
applying a first zero-crossing detector to the first input signal to identify a first zero-crossing point in the first input signal;
applying a second zero-crossing detector to the first input signal to identify a second zero-crossing point in the first input signal;
applying a third zero-crossing detector to the second input signal to identify a first zero-crossing point in the second input signal; and
applying a fourth zero-crossing detector to the second input signal to identify a second zero-crossing point in the second input signal.

14. The method of claim 9, wherein the one or more detectors comprise one or more peak detectors and one or more zero-crossing detectors, and wherein applying the one or more detectors to the first input signal and the second input signal comprises:
applying a first peak detector to the first input signal to identify a positive peak value in the first input signal;
applying a second peak detector to the first input signal to identify a negative peak value in the first input signal;
applying a third peak detector to the second input signal to identify a positive peak value in the second input signal;
applying a fourth peak detector to the second input signal to identify a negative peak value in the second input signal;
applying a first zero-crossing detector to the first input signal to identify a first zero-crossing point in the first input signal;
applying a second zero-crossing detector to the first input signal to identify a second zero-crossing point in the first input signal;
applying a third zero-crossing detector to the second input signal to identify a first zero-crossing point in the second input signal; and
applying a fourth zero-crossing detector to the second input signal to identify a second zero-crossing point in the second input signal.

15. The method of claim 14, further comprising:
using the positive peak value and the negative peak value in the first input signal, the positive peak value and the negative peak value in the second input signal, the first zero-crossing point and the second zero-crossing point in the first input signal, and the first zero-crossing point and the second zero-crossing point in the second input signal to generate the first constant and the second constant.

16. The method of claim 9, wherein the first input signal and the second input signal are received at substantially the same time.

17. The method of claim 9, further comprising:
storing the first constant and the second constant in a memory coupled to the magnetic field sensor.

18. The method of claim 9, further comprising, prior to receiving the first input signal on the first channel of the magnetic field sensor:
setting the first input signal at a first input of a processor to a constant value;
during the setting of the first input signal, measuring a first transition at an output of the processor;
setting the second input signal at a second input of the processor to the constant value;
during the setting of the second input signal, measuring a second transition at the output of the processor; and
using a deviation between the first transition and the second transition from respective expected transitions of the output signal of the processor to calculate the first constant and the second constant.

19. A magnetic field sensor comprising:
a first magnetic field sensing element for generating a first input signal and having a first axis of maximum sensitivity;
a second magnetic field sensing element for generating a second input signal and having a second axis of maximum sensitivity;
one or more detectors for receiving an output of the first magnetic field sensing element or the second magnetic field sensing element; and
at least one processor that receives an output of the one or more detectors and uses the output of the one or more detectors to calculate a first constant and a second constant, and then uses the first constant and the second constant to compensate for an orthogonality error between the first axis of maximum sensitivity and the second axis of maximum sensitivity.

20. The magnetic field sensor of claim 19, wherein the one or more detectors comprise one or more peak detectors, wherein the one or more peak detectors are configured to compare the output of the first input signal or the second input signal to a threshold value, and wherein the threshold value comprises a predetermined value that is determined to be a peak for the first input signal or the second input signal.

21. The magnetic field sensor of claim 20, wherein applying the one or more peak detectors comprises:
applying a first peak detector to the first input signal to identify a positive peak value in the first input signal;
applying a second peak detector to the first input signal to identify a negative peak value in the first input signal;
applying a third peak detector to the second input signal to identify a positive peak value in the second input signal; and
applying a fourth peak detector to the second input signal to identify a negative peak value in the second input signal.

22. The magnetic field sensor of claim 20, wherein the processor comprises one or more of a CORDIC processor, a look-up table, or a polynomial approximator.

23. The magnetic field sensor of claim 19, wherein the one or more detectors comprise at least one peak detector and at least one zero-crossing detector.

24. The magnetic field sensor of claim 23, wherein applying the at least one peak detector and the at least one zero-crossing detector comprises:
applying a first peak detector to the first input signal to identify a positive peak value in the first input signal;
applying a second peak detector to the first input signal to identify a negative peak value in the first input signal;
applying a third peak detector to the second input signal to identify a positive peak value in the second input signal;
applying a fourth peak detector to the second input signal to identify a negative peak value in the second input signal;
applying a first zero-crossing detector to the first input signal to identify a first zero-crossing point in the first input signal;
applying a second zero-crossing detector to the first input signal to identify a second zero-crossing point in the first input signal;
applying a third zero-crossing detector to the second input signal to identify a first zero-crossing point in the second input signal; and
applying a fourth zero-crossing detector to the second input signal to identify a second zero-crossing point in the second input signal.

25. A method of determining an orthogonality error of a magnetic field sensor, the method comprising:
setting a first input signal at a first input of a processor to a constant value during a first time period;
during the first time period, measuring a first transition at an output of the processor;
setting a second input signal at a second input of a processor to the constant value during a second time period different than the first time period;
during the second time period, measuring a second transition at the output of the processor;
receiving a first input signal on a first channel of the magnetic field sensor during a third time period different than the first time period and different than the second time period;
receiving a second input signal on a second channel of the magnetic field sensor during the third time period;
applying one or more detectors to the first input signal and the second input signal receiving during the third time period;
using an output of the one or more detectors and a deviation between the first transition and the second transition from respective expected transitions of an output signal of the processor to calculate a first constant and a second constant, wherein each of the first constant and the second constant is a function of the orthogonality error; and
using the first constant and the second constant to compensate for the orthogonality error between the first channel and the second channel of the magnetic field sensor.

26. The method of claim 25, wherein the first time period is non-overlapping with the second time period, and the second time period is non-overlapping with the third time period.

* * * * *